United States Patent
Takahashi et al.

(10) Patent No.: US 11,181,583 B2
(45) Date of Patent: Nov. 23, 2021

(54) BATTERY SYSTEM

(71) Applicant: TOYOTA JIDOSHA KABUSHIKI KAISHA, Toyota (JP)

(72) Inventors: Kenji Takahashi, Toyota (JP); Masafumi Nose, Toyota (JP); Yuji Nishi, Nagoya (JP); Nobuyasu Haga, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 805 days.

(21) Appl. No.: 15/617,412

(22) Filed: Jun. 8, 2017

(65) Prior Publication Data

US 2017/0356962 A1 Dec. 14, 2017

(30) Foreign Application Priority Data

Jun. 10, 2016 (JP) .............................. JP2016-116163

(51) Int. Cl.
*G01R 31/3835* (2019.01)
*G01R 31/367* (2019.01)
*G01R 31/36* (2020.01)
*G01R 31/374* (2019.01)
*H01M 4/38* (2006.01)
(Continued)

(52) U.S. Cl.
CPC ....... *G01R 31/3835* (2019.01); *G01R 31/367* (2019.01); *G01R 31/3648* (2013.01); *H01M 4/383* (2013.01); *H01M 4/52* (2013.01); *H01M 10/345* (2013.01); *H01M 10/486* (2013.01); *G01R 31/374* (2019.01); *H01M 2010/4271* (2013.01); *H01M 2220/20* (2013.01); *H01M 2300/0014* (2013.01)

(58) Field of Classification Search
None
See application file for complete search history.

(56) References Cited

U.S. PATENT DOCUMENTS

2006/0132092 A1* 6/2006 Hoffman ............... G01R 31/367
320/132
2006/0158155 A1* 7/2006 Tamezane ............ G01R 31/367
320/132
(Continued)

FOREIGN PATENT DOCUMENTS

JP 2007-333447 A 12/2007
WO 2006097760 A1 9/2006

*Primary Examiner* — Brent A. Fairbanks
(74) *Attorney, Agent, or Firm* — Sughrue Mion, PLLC

(57) ABSTRACT

A battery system includes a nickel hydride battery and an electronic control unit. The electronic control unit is configured to store data indicating a corresponding relationship between an elapsed time from start of use of the nickel hydride battery and a memory quantity. The data are data determined in a classified manner individually for each of conditions of use that are defined in such a manner as to include an open circuit voltage and a temperature. The electronic control unit is configured to sequentially calculate, with reference to the data, the memory quantity within a time when classification of the conditions of use does not change. The memory quantity is a quantity indicating an amount of change in voltage resulting from a memory effect. The electronic control unit is configured to estimate a current memory quantity of the nickel hydride battery by integrating the calculated memory quantity.

4 Claims, 19 Drawing Sheets

(51) Int. Cl.
*H01M 4/52* (2010.01)
*H01M 10/34* (2006.01)
*H01M 10/48* (2006.01)
*H01M 10/42* (2006.01)

(56) References Cited

U.S. PATENT DOCUMENTS

| | | | | |
|---|---|---|---|---|
| 2007/0029974 | A1* | 2/2007 | Uchida | G01R 31/3842 320/132 |
| 2009/0051321 | A1 | 2/2009 | Sato | |
| 2012/0310571 | A1* | 12/2012 | Takagi | G01R 31/392 702/65 |
| 2013/0013238 | A1* | 1/2013 | Kawakita | B60L 58/12 702/63 |
| 2015/0369867 | A1* | 12/2015 | Kanada | H02J 7/007 324/432 |

* cited by examiner

BATTERY SYSTEM

INCORPORATION BY REFERENCE

The disclosure of Japanese Patent Application No. 2016-116163 filed on Jun. 10, 2016 including the specification, drawings and abstract is incorporated herein by reference in its entirety.

BACKGROUND OF THE INVENTION

1. Field of the Invention

The invention relates to a battery system, and more particularly, to a battery system capable of estimating an amount of change in voltage resulting from a memory effect of a nickel hydride battery.

2. Description of Related Art

It is known that a memory effect is produced in a nickel hydride battery. The memory effect is a phenomenon in which the discharge voltage of the nickel hydride battery is lower than usual (when no memory effect is produced) in the case where the charging of the nickel hydride battery is repeated with the power accumulated therein not completely consumed (in the case of repetition of so-called supplementary charging). The memory effect can also be produced on a charge side of the nickel hydride battery. The charge voltage of the nickel hydride battery is higher than usual on the charge side thereof.

There is proposed an art for estimating an amount of change in voltage resulting from the memory effect of the nickel hydride battery (hereinafter referred to also as "a memory quantity"). This is because, for example, the accuracy in estimating a state of charge (an SOC) of the nickel hydride battery can be enhanced by estimating the memory quantity. For example, Japanese Patent Application Publication No. 2007-333447 (JP 2007-333447 A) discloses a state-of-charge estimation device that calculates an electromotive force of a nickel hydride battery based on an open circuit voltage of the nickel hydride battery and that estimates an SOC from the electromotive force using a relationship between the calculated electromotive force and the SOC. The state-of-charge estimation device disclosed in Japanese Patent Application Publication No. 2007-333447 (JP 2007-333447 A) enhances the accuracy in estimating the SOC by correcting the open circuit voltage in accordance with the memory quantity prior to the estimation of the SOC.

SUMMARY OF THE INVENTION

In the state-of-charge estimation device disclosed in Japanese Patent Application Publication No. 2007-333447 (JP 2007-333447 A), the memory quantity is taken into account in estimating the SOC as described above. More specifically, a map that prescribes a relationship between the memory quantity and parameters that change in such a manner as to correspond to a change in voltage resulting from a memory effect is prepared in advance, and the memory quantity is calculated through the use of this map. In Japanese Patent Application Publication No. 2007-333447 (JP 2007-333447 A), a total amount of electricity with which the nickel hydride battery is charged and which is discharged from the nickel hydride battery, a total running distance of a vehicle that is mounted with the nickel hydride battery, and a total charge/discharge time of the nickel hydride battery are mentioned as the aforementioned parameters.

All the aforementioned parameters disclosed in Japanese Patent Application Publication No. 2007-333447 (JP 2007-333447 A) indicate an integration result to the present. Therefore, if the integration result to the present remains the same, the current memory quantity also remains the same regardless of a condition during a period of use of the nickel hydride battery. However, the memory effect can depend on the condition during the period of use. In the art disclosed in Japanese Patent Application Publication No. 2007-333447 (JP 2007-333447 A), there is a room for improvement in the accuracy in estimating the memory quantity.

The invention provides a battery system that enhances the accuracy in estimating a memory quantity of a nickel hydride battery.

A battery system according to one aspect of the invention includes a nickel hydride battery and an electronic control unit. The electronic control unit is configured to store data indicating a corresponding relationship between an elapsed time from start of use of the nickel hydride battery and a memory quantity. The data are data determined in a classified manner individually for each of conditions of use that are defined in such a manner as to include an open circuit voltage of the nickel hydride battery and a temperature of the nickel hydride battery. The electronic control unit is configured to sequentially calculate, with reference to the data, the memory quantity within a time when classification of the conditions of use does not change. The memory quantity is a quantity indicating an amount of change in voltage resulting from a memory effect of the nickel hydride battery. The electronic control unit is configured to estimate a current memory quantity of the nickel hydride battery by integrating the calculated memory quantity.

In the battery system according to the aforementioned aspect of the invention, the electronic control unit may be configured to repeatedly carry out an integrated memory quantity estimation process for estimating an integrated memory quantity indicating an integrated value of the memory quantity. The integrated memory quantity estimation process may be a process for calculating, with reference to data corresponding to the conditions of use during a predetermined period, a memory quantity generated during the predetermined period from an integrated memory quantity to start of the predetermined period and the conditions of use during the predetermined period, and adding the calculated memory quantity generated during the predetermined period to the integrated memory quantity to start of the predetermined period.

While the main factors determining the memory quantity generated during the predetermined period are the open circuit voltage and temperature of the nickel hydride battery according to results of experiments (which will be described later) conducted by the inventors, the electronic control unit stores the data indicating the corresponding relationship between the memory quantity and the elapsed time from the start of use of the nickel hydride battery, individually for each of the conditions of use that are defined in such a manner as to include the open circuit voltage and temperature of the nickel hydride battery, in the battery system according to this aspect of the invention. Accordingly, the electronic control unit can accurately calculate the memory quantity within the time when classification of the conditions of use does not change, by referring to the data corresponding to the condition of use of the nickel hydride battery. Furthermore, the current memory quantity of the nickel hydride battery can also be accurately estimated, by integrating the memory quantity accurately calculated in this manner.

In the battery system according to the aforementioned aspect of the invention, the data may be data indicating a corresponding relationship between a power root of the aforementioned elapsed time and a generation speed of the memory quantity. An exponent of the power root may be determined such that the generation speed becomes constant with respect to the power root of the elapsed time. The electronic control unit may be configured to calculate, with reference to the data corresponding to the conditions of use during a predetermined period, the generation speed during the predetermined period. The electronic control unit may be configured to calculate a product of the generation speed and a power root of the predetermined period as the memory quantity generated during the predetermined period. The electronic control unit may be configured to calculate a memory quantity at end of the predetermined period by adding the calculated memory quantity to the memory quantity to start of the predetermined period.

With the battery system according to this aspect of the invention, in the data indicating the corresponding relationship between the aforementioned elapsed time and the memory quantity, the exponent of the power root (n in the n-th power root of the elapsed time) is determined such that the generation speed of the memory quantity becomes constant with respect to the power root of the elapsed time. This is equivalent to converting the aforementioned data from curves to straight lines by setting a time axis in the data indicating the corresponding relationship between the elapsed time and the memory quantity on a power root scale instead of a generally employed normal scale (see FIG. 11 that will be described later). Thus, it is sufficient that the electronic control unit store the gradients of the straight lines instead of the shapes of the curves, so the data volume can be reduced. Furthermore, while a computation process for determining points of the curves to be referred to is needed in the case where the curves are used, the use of the straight lines eliminates the necessity to carry out the computation process. Thus, there is no need to sequentially update the integrated memory quantity, and the integrated memory quantity can be calculated at an arbitrary timing (the details will be described later with reference to the drawings).

In the battery system according to the aforementioned aspect of the invention, the electronic control unit may be configured to acquire a first condition of use at a timing for stopping the battery system and a second condition of use at a timing for activating the battery system. The electronic control unit may be configured to complement, based on the first condition of use and the second condition of use, a condition of use in a stop period of the battery system from the timing for stopping the battery system to the timing for activating the battery system. The electronic control unit may be configured to calculate, with reference to the data corresponding to the complemented condition of use, a memory quantity generated during the stop period.

With the battery system according to this aspect of the invention, the accuracy in estimating the current memory quantity can be enhanced by taking the memory quantity generated during the stop period of the battery system into account as well. Furthermore, the electronic control unit can be stopped during the stop period, by calculating the memory quantity during the stop period after the battery system is activated. Therefore, the power consumption of the electronic control unit during the stop period can be reduced.

The battery system according to the aforementioned aspect of the invention makes it possible to enhance the accuracy in estimating a memory quantity of a nickel hydride battery.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
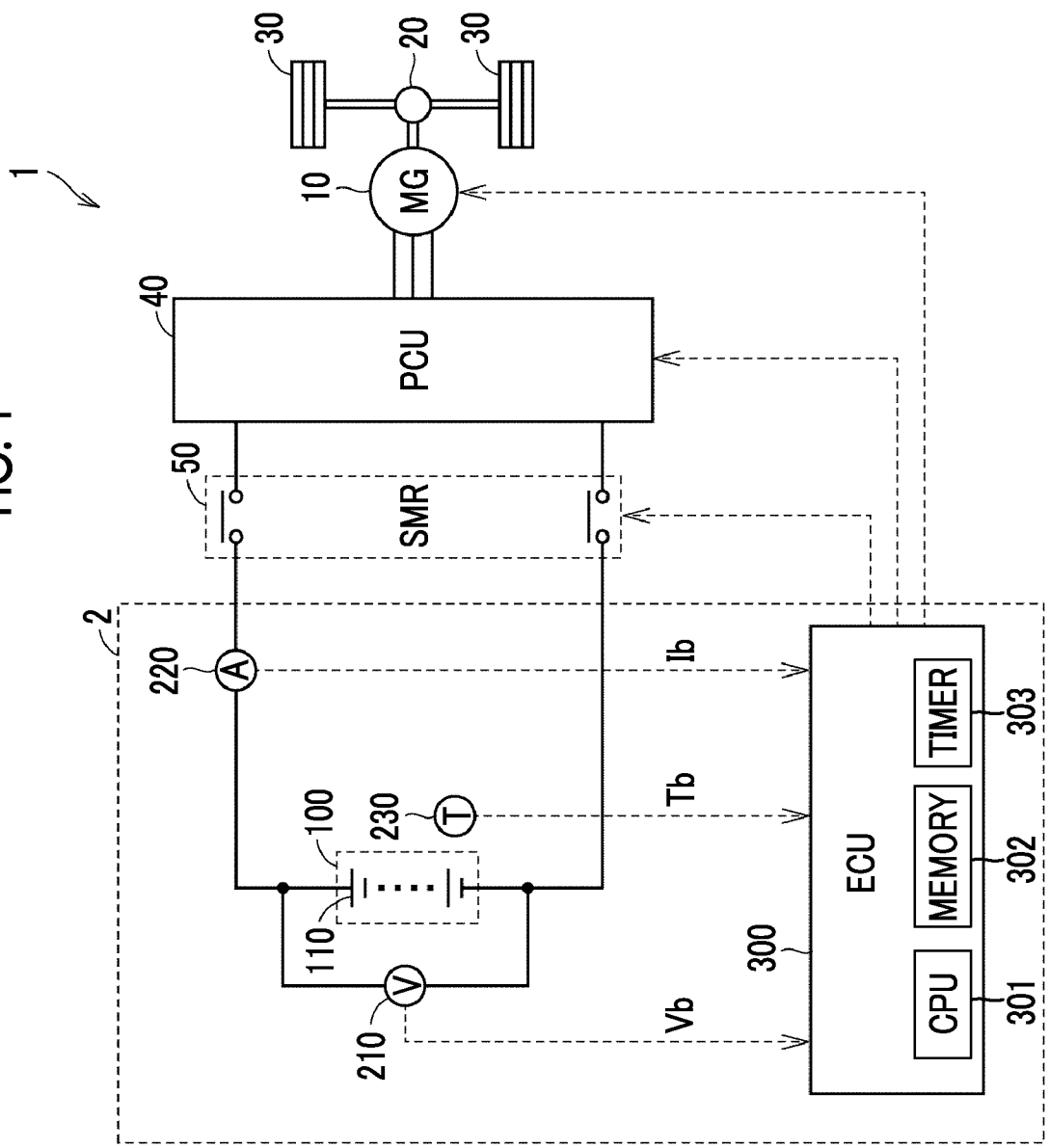
FIG. 1 is a block diagram schematically showing the general configuration of a vehicle that is mounted with a battery system according to the first embodiment of the invention.

The embodiments of the invention will be described hereinafter in detail with reference to the drawings. Incidentally, like or equivalent components or elements in the drawings are denoted by like reference symbols, and the description thereof will not be repeated.

An exemplary configuration in which a vehicle is mounted with a battery system according to the first embodiment of the invention will be described hereinafter. However, the battery system is not absolutely required to be for vehicle use, but may be stationary.

FIG. 1 is a block diagram schematically showing the general configuration of a vehicle that is mounted with the battery system according to the first embodiment of the invention. A vehicle 1 is a hybrid vehicle, an electric vehicle or a fueled vehicle. The vehicle 1 is equipped with a motor-generator (an MG) 10, a motive power transmission gear 20, driving wheels 30, a power control unit (a PCU) 40, a system main relay (an SMR) 50 and a battery system 2. The battery system 2 is equipped with a battery 100, a voltage sensor 210, a current sensor 220, a temperature sensor 230 and an electronic control unit (an ECU) 300.

The motor-generator 10 is, for example, a three-phase AC rotating electrical machine. An output torque of the motor-generator 10 is transmitted to the driving wheels 30 via the motive power transmission gear 20, which is configured to include a decelerator and a motive power splitting mechanism. The motor-generator 10 can also generate power through a turning force of the driving wheels 30 at the time of regenerative braking operation of the vehicle 1. In a hybrid vehicle that is mounted with an engine (not shown) as well as the motor-generator 10, a necessary vehicle driving force is generated by operating the engine and the motor-generator 10 in a cooperative manner. Incidentally, only the single motor-generator is provided in the configuration shown in FIG. 1, but the number of motor-generators should not be limited thereto. It is also appropriate to adopt a configuration in which a plurality of (e.g., two) motor-generators are provided.

Although not shown in the drawing, the PCU 40 includes an inverter and a converter. In discharging the battery 100, the converter boosts a voltage supplied from the battery 100, and supplies this boosted voltage to the inverter. The inverter converts a DC power supplied from the converter into an AC power, and drives the motor-generator 10. On the other hand, in charging the battery 100, the inverter converts an AC power generated by the motor-generator 10 into a DC power, and supplies this DC power to the converter. The converter lowers the voltage supplied from the inverter, and supplies this lowered voltage to the battery 100.

The SMR 50 is electrically connected to a current path that links the battery 100 and the PCU 40 with each other. In the case where the SMR 50 is closed in accordance with a control signal from the ECU 300, power can be exchanged between the battery 100 and the PCU 40.

The battery 100 is a DC power supply that is configured to be rechargeable. In the present embodiment of the invention, the battery 100 is configured to include a nickel hydride battery. The detailed configuration of each of cells 110 included in the battery 100 will be described with reference to FIG. 2.

The voltage sensor 210 detects a voltage Vb of the battery 100. The current sensor 220 detects a current Ib input/output to/from the battery 100. The temperature sensor 230 detects a temperature Tb of the battery 100. The respective sensors output detection results thereof to the ECU 300.

The ECU 300 is configured to include a central processing unit (a CPU) 301, a memory (a read only memory (a ROM) and a random access memory (a RAM)) 302, a timer 303, input/output buffers (not shown) and the like. The ECU 300 controls the respective components such that the vehicle 1 and the battery system 2 assume a desired state, based on signals received from the respective sensors, and a map and a program that are stored in the memory 302. A process for estimating an amount of change in voltage resulting from a memory effect produced in the battery 100 can be mentioned as a main process that is carried out by the ECU 300. This process will be described later.

Figure 2:
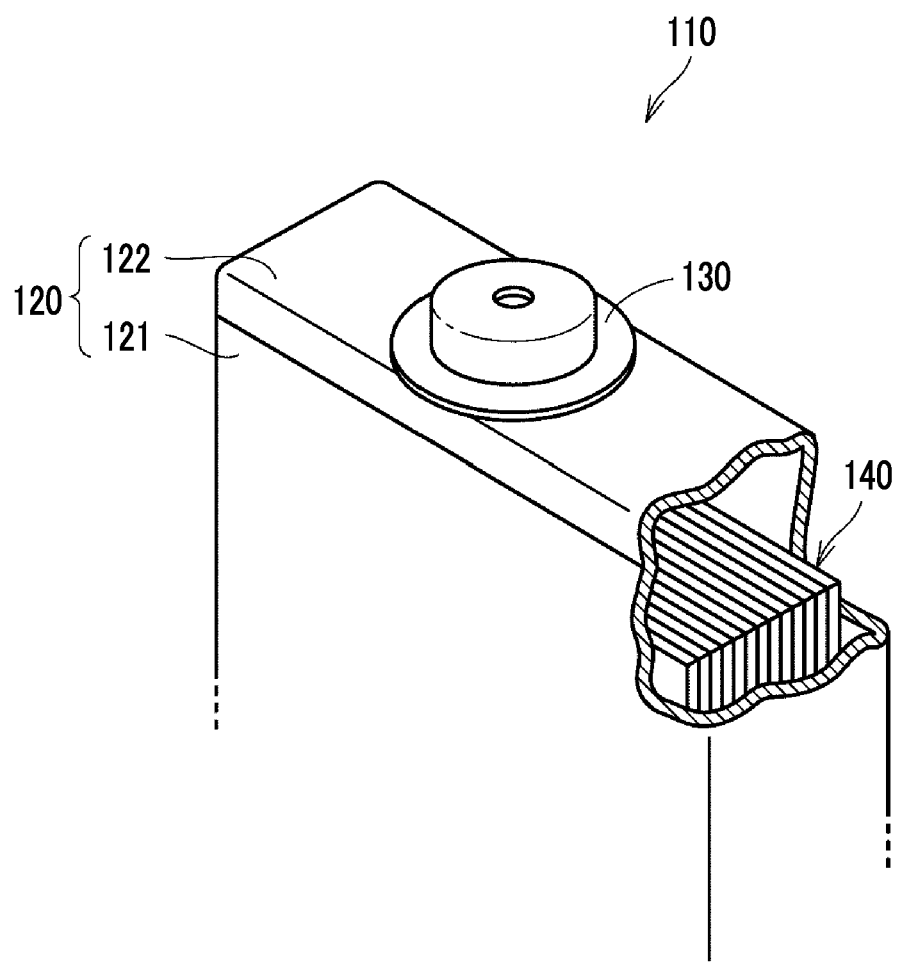
FIG. 2 is a view showing the configuration of a cell.

FIG. 2 is a view showing the configuration of each of the cells 110. The respective cells 110 included in the battery 100 have a common configuration, so FIG. 2 representatively shows only one of the cells 110. This cell 110 is, for example, a rectangular sealed cell. The cell 110 includes a case 120, a safety valve 130 that is provided on the case 120, an electrode body 140 that is accommodated in the case 120, and an electrolytic solution (not shown). Incidentally, FIG. 2 shows the electrode body 140 with part of the case 120 in a perspective view.

The case 120 includes a case body 121 and a lid body 122, which are both made of metal. The case 120 is sealed by welding the lid body 122 on an opening portion of the case body 121 along the entire circumference thereof. The safety valve 130 partially discharges the gases (hydrogen gas and the like) inside the case 120 to the outside when the pressure inside the case 120 exceeds a predetermined value.

The electrode body 140 includes positive plates, negative plates and separators. Each of the positive plates is inserted in a corresponding one of the bag-shaped separators. The positive plates, which are inserted in the separators respectively, and the negative plates are alternately laminated to constitute the electrode body 140. Each of the positive plates and each of the negative plates are electrically connected to a positive electrode terminal (not shown) and a negative electrode terminal (not shown) respectively.

Various kinds of conventionally known materials can be used as the materials of the electrode body 140 and the electrolytic solution. In the present embodiment of the invention, for example, an electrode plate that includes a positive electrode active material layer containing nickel hydroxide ($Ni(OH)_2$ or $NiOOH$) and an active material support body such as foamed nickel or the like is used as each of the positive plates. An electrode plate containing a hydrogen occluding alloy is used as each of the negative plates. A nonwoven fabric made of a synthetic resin subjected to a hydrophilization treatment is used as each of the separators. An alkaline water solution containing potassium hydroxide (KOH) or sodium hydroxide (NaOH) is used as the electrolytic solution.

In the battery system 2 configured as described above, there is a demand to accurately estimate "a memory quantity" indicating an amount of change in voltage (an amount of fall in voltage or an amount of rise in voltage) resulting from the memory effect of the battery 100.

The inventors have focused attention on a condition regarding the voltage Vb (more specifically, the open circuit voltage) and the temperature Tb of the battery 100 as a main factor determining the magnitude of the memory quantity, from results of three different experiments that will be described later. The condition that is defined in such a manner as to include a combination of the open circuit voltage (an OCV) and the temperature Tb of the battery 100 will be referred to hereinafter also as "a condition of use" of the battery 100. Furthermore, the inventors have focused attention on the fact that there is no need to consider "the condition of use" of the battery 100 prior to a certain period in estimating a memory quantity generated during this period (which will be described later). Based on these pieces of knowledge, the first embodiment of the invention adopts a configuration in which a memory quantity generated during a predetermined period is sequentially integrated to estimate a memory quantity as a total amount representing an integrated value thereof (hereinafter referred to also as "an integrated memory quantity"). This is because the integrated memory quantity can also be accurately estimated if the memory quantity during the predetermined period can be accurately estimated through the use of an experiment result or a simulation result by adopting this method. This method will be described hereinafter in detail.

Figure 3:
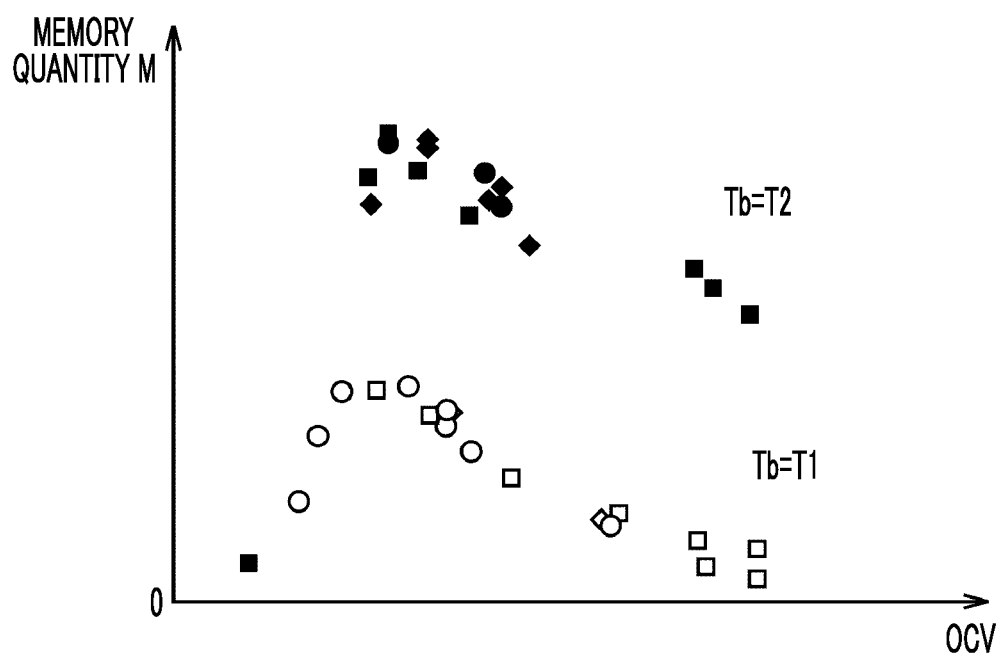
FIG. 3 is a view for illustrating results of three different tests conducted by the inventors.

FIG. 3 is a view for illustrating the three different experiments conducted by the inventors. As shown in a table in an upper part of FIG. 3, the three different experiments are a constant-voltage test, a shelf test and a cycle test of the battery 100.

In the constant-voltage test, the voltage Vb of the battery 100 is held constant by applying a voltage to the battery 100 from the outside of the battery 100 through the use of an external power supply (not shown) for a predetermined period (for several days in the example shown in FIG. 3). In the shelf test, the battery 100 is left unattended for the predetermined period without applying a voltage thereto through the use of the external power supply. While the influence of a fall in SOC resulting from self-discharge of the battery 100 emerges in the shelf test, the influence of a fall in SOC resulting from self-discharge of the battery 100 does not emerge in the constant-voltage test. Accordingly, the magnitude of the influence of self-discharge of the battery 100 on the memory quantity can be obtained by comparing the results of these tests with each other.

In the cycle test, the battery 100 is repeatedly charged and discharged at a predetermined SOC width for the predetermined period. The magnitude of the influence of a charge/discharge current on the memory quantity can be obtained by comparing results of a plurality of cycle tests with different magnitudes of the charge/discharge current with one another.

A result obtained by conducting the three different tests for the same period (the aforementioned predetermined period) in the case where the temperature Tb of the battery 100 is equal to T1 (a room temperature) and in the case where the temperature Tb is equal to T2 (a high temperature) that is higher than T1 is shown on a graph in a lower part of FIG. 3, as a relationship between the memory quantity and the open circuit voltage OCV. Each blank square marker indicates a result of the constant-voltage test at the temperature T1, each blank circular marker indicates a result of the shelf test at the temperature T1, and each blank rhomboid marker indicates a result of the cycle test at the temperature T1. Each black square marker indicates a result of the constant-voltage test at the temperature T2, each black circular marker indicates a result of the shelf test at the temperature T2, and each black rhomboid marker indicates a result of the cycle test at the temperature T2.

In the graph of FIG. 3, the axis of abscissa represents the OCV of each of the cells 110, and the axis of ordinate represents a memory quantity (an amount of fall in voltage at the time of discharge in this case) M. As indicated by the graph of FIG. 3, the memory quantity M is especially large when the OCV is within a predetermined range. Besides, the memory quantity M increases as the temperature Tb of the battery 100 (the respective cells 110) rises. It is apparent from these results that the memory quantity generated during the predetermined period is determined in accordance with the condition of use (OCV, Tb) that is defined by a combination of the OCV and the temperature Tb of the battery 100.

On the other hand, the result of the constant-voltage test (see the square markers) and the result of the shelf test (see the circular markers) are plotted close to each other at each of the temperatures T1 and T2. This reveals that the influence of self-discharge of the battery 100 on the memory quantity is relatively small. Furthermore, the result of the cycle test (see the rhomboid markers) is also plotted close to the results of the other two tests (see the square and circular markers). This reveals that the influence of the charge/discharge current of the battery 100 on the memory quantity is also relatively small.

Incidentally, there is a correlation between the OCV and the SOC. Therefore, a result similar to that of FIG. 3 is obtained even in the case where the SOC is used instead of the OCV on the axis of abscissa. Besides, the memory effect of the discharge side has been representatively described with reference to FIG. 3, but the memory quantity can be defined by the condition of use (OCV, Tb) as to the memory effect of the charge side as well, although the amount of change in voltage has a different sign.

The memory quantity that is generated with the lapse of time from the start of use of the battery 100 can be estimated in accordance with the condition of use (OCV, Tb), by conducting the experiments shown in FIG. 3 as the example under various conditions of use (OCV, Tb).

Figure 4:
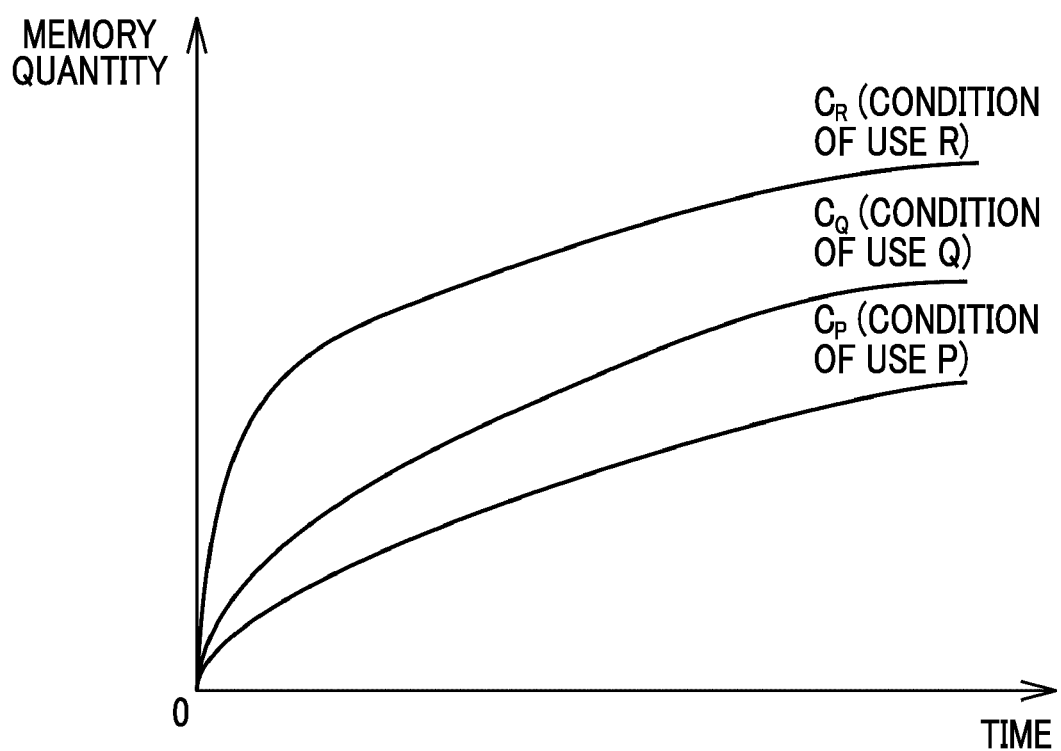
FIG. 4 is a time chart showing a corresponding relationship between an elapsed time and a memory quantity under respective conditions of use.

FIG. 4 is a time chart showing a corresponding relationship between the elapsed time and the memory quantity under the respective conditions of use. In FIG. 4, the axis of abscissa represents the elapsed time from the start of use of the battery 100, and the axis of ordinate represents the memory quantity. Incidentally, the use of the battery 100 may be started (an initial value of the elapsed time) when the battery 100 is manufactured or when the battery 100 is charged/discharged in a refreshing manner (when the battery 100 is charged or discharged to eliminate the memory effect produced in the battery 100).

A curve indicating how the memory quantity increases with the lapse of time can be acquired individually for each of the conditions of use as shown in FIG. 4, by conducting the above-mentioned experiments individually under each of the conditions of use. Incidentally, FIG. 4 and FIG. 5, which will be described later, illustrate an example in which curves $C_P$ to $C_R$ corresponding to three different conditions of use P to R respectively are acquired, for the sake of easy understanding. In fact, however, similar curves are acquired as to more conditions of use.

"The integrated memory quantity" can be estimated by calculating the memory quantities generated under the conditions of use P to R with reference to the curves $C_P$ to $C_R$ respectively and repeatedly carrying out the process for integrating the calculated memory quantities. This process will be referred to also as "an integrated memory quantity estimation process", and will be described hereinafter in detail.

Figure 5A:
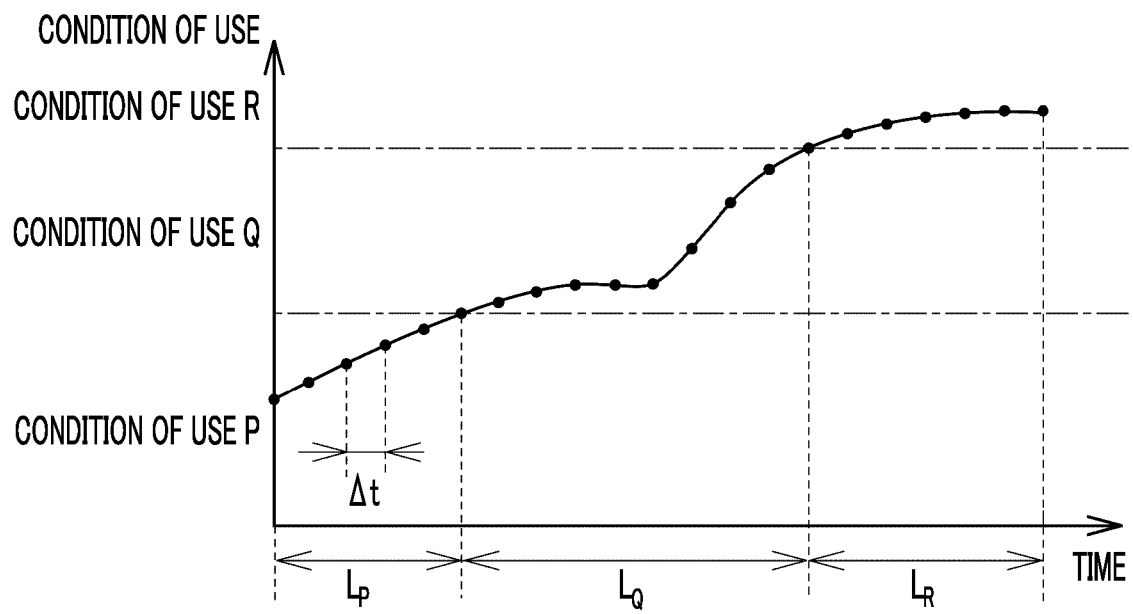
FIG. 5A is a time chart for illustrating a memory quantity estimation process in the first embodiment of the invention.
Figure 5B:
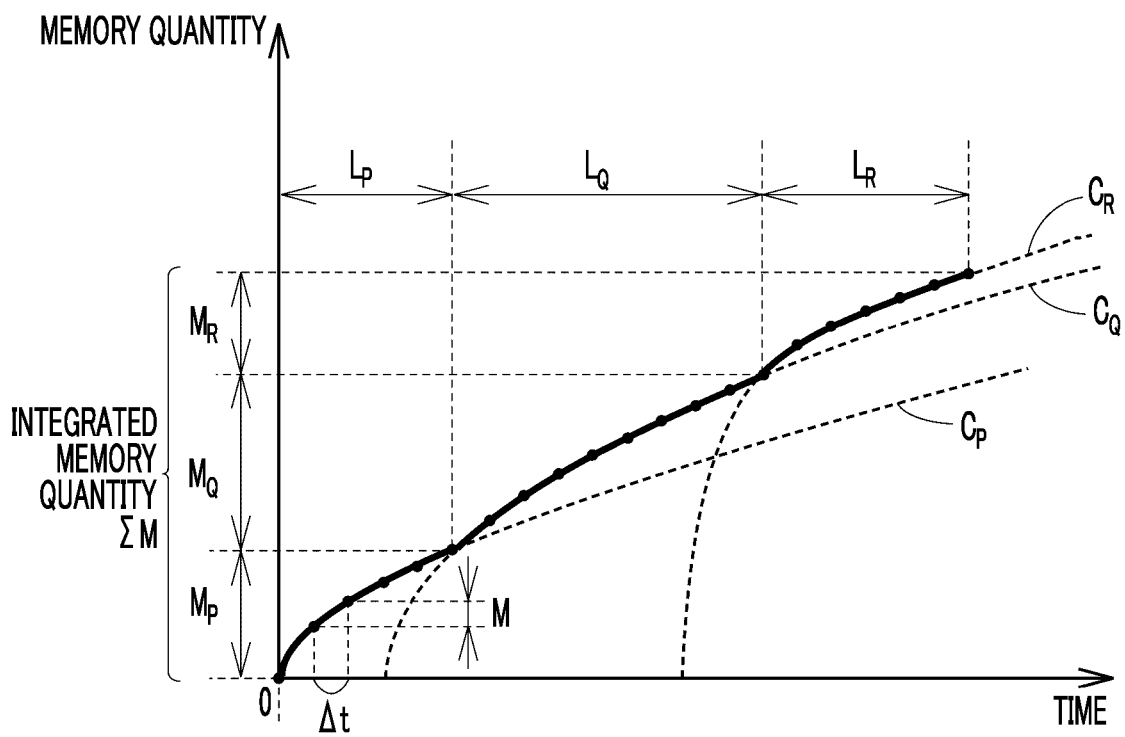
FIG. 5B is a time chart for illustrating the memory quantity estimation process in the first embodiment of the invention.

FIGS. 5A and 5B are time charts for illustrating the integrated memory quantity estimation process in the first embodiment of the invention. In FIG. 5A, the axis of abscissa represents an elapsed time from the start of use of the battery 100, and the axis of ordinate represents a condition of use. FIG. 5A illustrates a case where a determination on the condition of use is made at intervals of a predetermined period Δt and the condition of use changes in the sequence of P, Q and R. Periods under the conditions of use P, Q and R are denoted by $L_P$, $L_Q$ and $L_R$ respectively.

In FIG. 5B, the axis of abscissa represents an elapsed time from the start of use of the battery 100, and the axis of ordinate represents a memory quantity. First of all, under the condition of use P, the memory quantity M is sequentially integrated at intervals of the predetermined period Δt with reference to the curve $C_P$. As a result, the memory quantity generated during the lapse of the period $L_P$ under the condition of use P is equal to $M_P$. If the integration result of the memory quantity M is referred to as "an integrated memory quantity ΣM", the integrated memory quantity ΣM upon the lapse of the period $L_P$ is equal to $M_P$.

Subsequently, when the condition of use changes from P to Q, the memory quantity M is sequentially integrated at intervals of the predetermined period Δt with reference to the curve $C_Q$ corresponding to the integrated memory quantity ΣM=$M_P$ (a curve obtained by moving the curve $C_Q$ shown in FIG. 4 by $L_P$ parallel to the direction of a time axis), from a point on the curve $C_Q$. In the case where the memory quantity generated during the lapse of the period $L_Q$ under the condition of use Q is equal to $M_Q$, the integrated memory quantity ΣM upon the lapse of the period $L_Q$ is equal to the sum of $M_P$ and $M_Q$, namely, ($M_P$+$M_Q$).

Furthermore, when the condition of use changes from Q to R, the memory quantity M is sequentially integrated at intervals of the predetermined period Δt with reference to the curve $C_R$ corresponding to the integrated memory quantity ΣM=($M_P$+$M_Q$) (a curve obtained by moving the curve $C_R$ shown in FIG. 4 by ($L_P$+$L_Q$) parallel to the direction of the time axis) from a point on the curve $C_R$. In the case where the memory quantity generated during the lapse of the period $L_R$ under the condition of use R is equal to $M_R$, the integrated memory quantity ΣM generated in a total period (a period of $L_P$+$L_Q$+$L_R$) is equal to the sum of $M_P$, $M_Q$ and $M_R$, namely, ($M_P$+$M_Q$+$M_R$).

As described hitherto, the present embodiment of the invention is premised on that the integrated memory quantity ΣM calculated in accordance with the curve before a transition can be inherited in calculating the integrated memory quantity ΣM by making the transition to a different curve as the condition of use changes. That is, the present embodiment of the invention is premised on the electrochemical knowledge that the state of the battery 100 influencing the memory effect (mainly the state of the positive electrode active material layer) remains unchanged in the case where the integrated memory quantity ΣM reaches a predetermined value according to a certain curve and in the case where the integrated memory quantity ΣM reaches the aforementioned predetermined value according to another curve.

As described above, in the first embodiment of the invention, the integrated memory quantity ΣM generated during the total period can be calculated by repeatedly carrying out the process for calculating the memory quantities M corresponding to the respective conditions of use P to R at intervals of the predetermined period Δt and sequentially integrating the calculated memory quantities M.

The aforementioned contents can be explained using a recurrence expression. That is, as expressed by an expression (1) shown below, an integrated memory quantity ΣM(N) in the N-th integration process can be calculated by adding a memory quantity M(N) corresponding to a condition of use during a period from the time of the (N-1)-th integration process to the time of the N-th integration process (during the predetermined period Δt) to an integrated memory quantity ΣM(N-1) to the (N-1)-th integration process. It should be noted that N is a natural number.

$$\Sigma M(N) = \Sigma M(N-1) + M(N) \tag{1}$$

Figure 6:
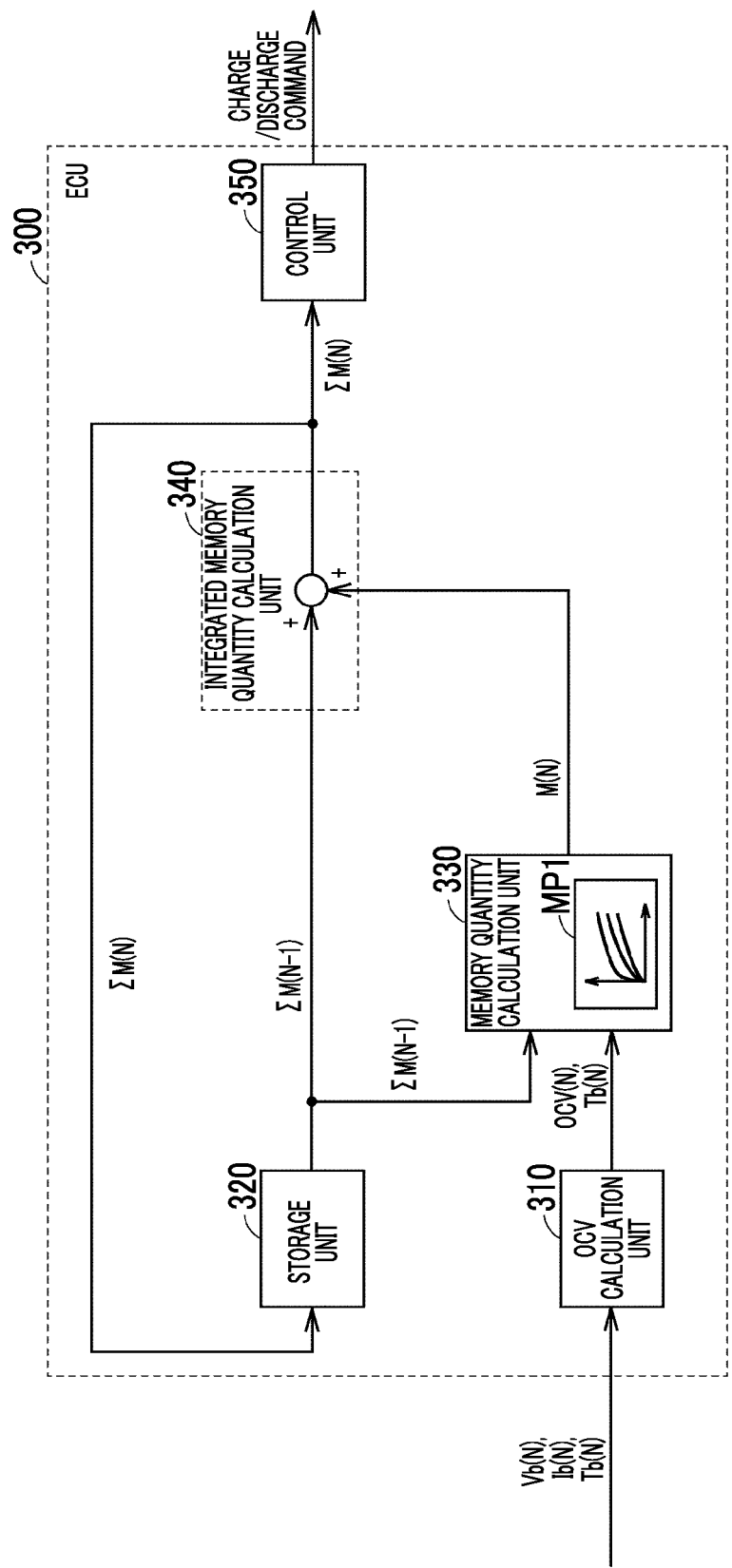
FIG. 6 is a functional block diagram of an ECU in the first embodiment of the invention.

FIG. 6 is a functional block diagram of the ECU 300 in the first embodiment of the invention. The ECU 300 includes an OCV calculation unit 310, a storage unit 320, a memory quantity calculation unit 330, an integrated memory quantity calculation unit 340 and a control unit 350. FIG. 6 illustrates the functions of respective functional blocks in the N-th integration process.

The OCV calculation unit 310 receives a voltage Vb(N), a current Ib(N) and a temperature Tb(N) of the battery 100 from the voltage sensor 210, the current sensor 220 and the temperature sensor 230 respectively. The OCV calculation unit 310 calculates an OCV(N) of the battery 100 by subtracting an amount of fall in voltage (a product of the current Ib(N) and an internal resistance R of the battery 100) from the voltage Vb(N), and outputs the OCV(N) and the temperature Tb(N) to the memory quantity calculation unit 330.

The storage unit 320 stores the integrated memory quantity ΣM(N-1) calculated at the time of the (N-1)-th integration process. The storage unit 320 outputs the integrated memory quantity ΣM(N-1) to the memory quantity calculation unit 330, and outputs the integrated memory quantity ΣM(N-1) to the integrated memory quantity calculation unit 340.

The memory quantity calculation unit 330 stores a map MP1 that will be described below. The memory quantity calculation unit 330 refers to the map MP1 upon receiving the OCV(N) and the temperature Tb(N) from the OCV calculation unit 310 as the condition of use during the period from the time of the (N-1)-th integration process to the time of the N-th integration process (during the predetermined period Δt) (the condition of use at the time of the N-th integration process).

Figure 7:
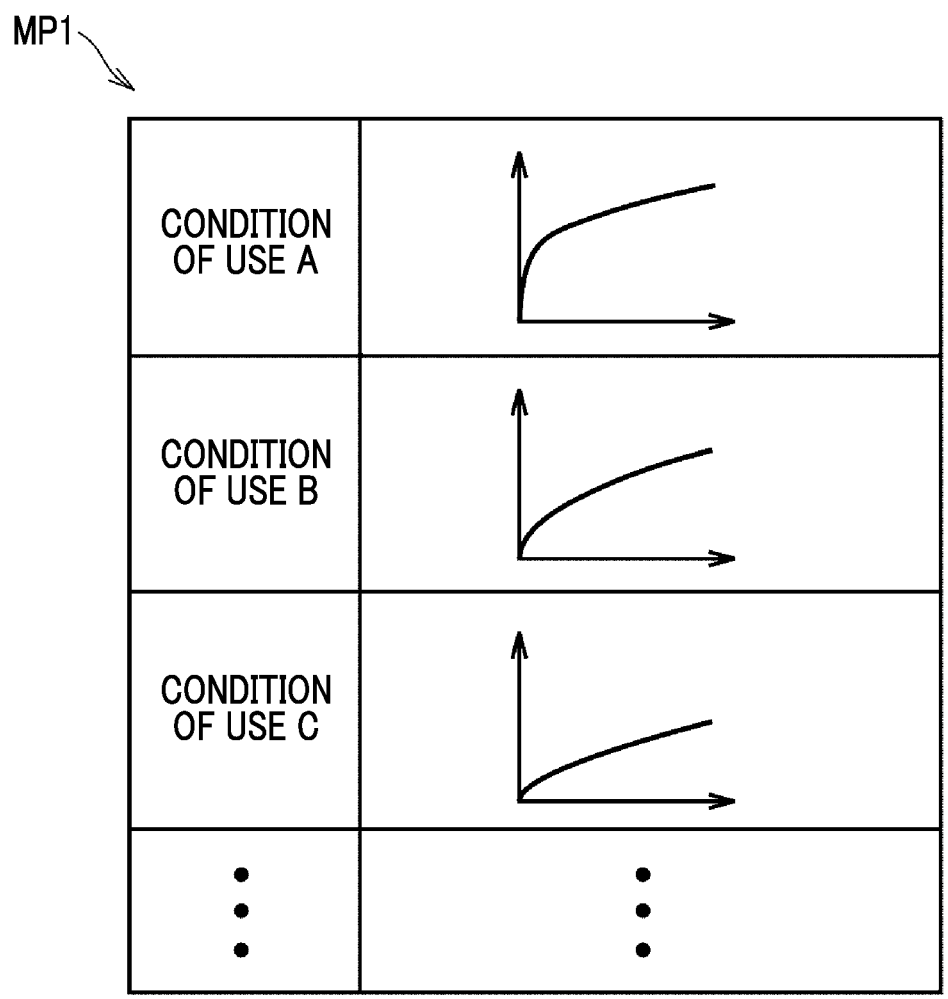
FIG. 7 is a conceptual view of a map that is stored in a memory quantity calculation unit in the first embodiment of the invention.

FIG. 7 is a conceptual view of the map MP1 that is stored in the memory quantity calculation unit 330 in the first embodiment of the invention. In the map MP1, data indicating a corresponding relationship between the elapsed time and the memory quantity (see the curves $C_P$ to $C_R$ in FIGS. 4 and 5) are prescribed individually for each of the conditions of use (OCV, Tb) that are defined by a combination of the OCV and the temperature Tb of the battery 100. Accordingly, as described with reference to FIG. 4, the ECU 300 can calculate the memory quantity M(N) newly generated during the period from the time of the (N-1)-th integration process to the time of the N-th integration process, by referring to the curves corresponding to the conditions of use at the time of the N-th integration process.

A large number of conditions of use in the map MP1 mean that results obtained by conducting the experiments described with reference to FIG. 3 under more conditions of the OCV and more conditions of the temperature Tb can be reflected by the map MP1, so the accuracy in estimating the memory quantity M can be enhanced. On the other hand, while the map MP1 is stored in the memory 302 of the ECU 300, the size of the map (the data volume of the map MP1) increases as the number of conditions of use increases. Therefore, the capacity necessary for the memory 302 can be large, and the computation load of the CPU 301 can be large. Accordingly, it is desirable to determine the number of conditions of use in the map MP1 in consideration of the balance between the accuracy in estimating the memory quantity M and the processing capacity of the ECU 300.

Incidentally, the curve representing the corresponding relationship between the elapsed time and the memory quantity under each of the conditions of use is equivalent to "the data corresponding to the condition of use" according to the invention. However, the method for prescribing "the data corresponding to the condition of use" is not limited to the map, but may be a function (a relational expression). Besides, a similar result is obtained from the three different experiments as described with reference to FIG. 3. Therefore, it is not indispensable to conduct all the experiments to prepare the map MP1. The map MP1 can also be prepared by conducting one or two of the experiments.

Returning to FIG. 6, curves indicate how the memory quantity increases with the lapse of time (see the curves $C_P$ to $C_R$ in FIG. 5B). In consequence, in calculating the memory quantity M(N) newly generated in the N-th integration process with reference to the aforementioned curves, information on the integrated memory quantity ΣM(N−1) to the (N−1)-th integration process is needed to determine which point or points of the curves should be referred to. The memory quantity calculation unit 330 calculates the memory quantity M(N) from the OCV(N) and the temperature Tb at the time of the N-th integration process and the integrated memory quantity ΣM(N−1) to the time of the (N−1)-th integration process, by referring to the curve corresponding to the condition of use at the time of the N-th integration process from the map MP1, and outputs the calculated memory quantity M(N) to the integrated memory quantity calculation unit 340.

The integrated memory quantity calculation unit 340 receives the memory quantity M(N) at the time of the N-th integration process from the memory quantity calculation unit 330, and receives the integrated memory quantity ΣM(N−1) to the time of the (N−1)-th integration process from the storage unit 320. The integrated memory quantity calculation unit 340 calculates the integrated memory quantity ΣM(N) by adding the memory quantity M(N) to the integrated memory quantity ΣM(N−1) (see the aforementioned expression (1)), and outputs the calculated integrated memory quantity ΣM(N) to the control unit 350. Besides, the integrated memory quantity calculation unit 340 outputs the integrated memory quantity ΣM(N) to the storage unit 320 so that the storage unit 320 stores the integrated memory quantity ΣM(N).

The control unit 350 outputs a charge/discharge command to the battery 100, based on the integrated memory quantity ΣM(N) from the integrated memory quantity calculation unit 340. For example, when a predetermined condition including that the absolute value of the integrated memory quantity ΣM(N) becomes equal to or larger than a reference value is fulfilled, the control unit 350 outputs a refresh charge command or a refresh discharge command to eliminate the memory effect produced in the battery 100.

Figure 8:
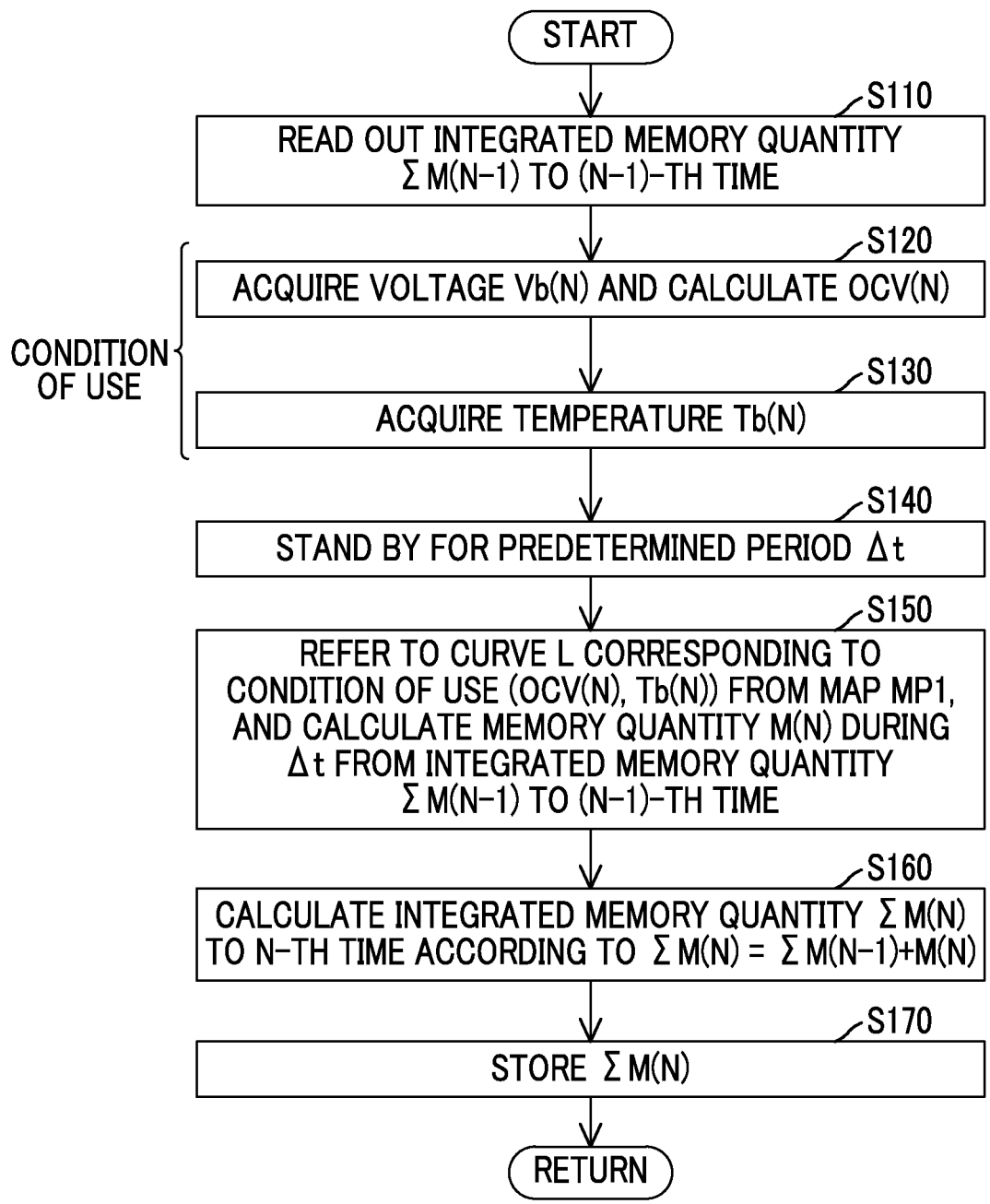
FIG. 8 is a flowchart showing an integrated memory quantity estimation process in the first embodiment of the invention.

FIG. 8 is a flowchart showing an integrated memory quantity estimation process in the first embodiment of the invention. The processes of the flowchart shown in FIG. 8 and flowcharts shown in FIGS. 10, 16, 17 and 19, which will be described later, are invoked from a main routine (not shown) and carried out on a predetermined cycle or every time a predetermined condition is fulfilled. Respective steps (which will be abbreviated hereinafter as "S") included in these flowcharts are basically realized through software processing by the ECU 300. However, one, some or all of the steps may be realized by a piece of hardware (an electric circuit) that is created in the ECU 300.

The process of the flowchart shown in FIG. 8 is repeatedly carried out to sequentially update the integrated memory quantity ΣM. This flowchart shows the N-th integration process, and the integrated memory quantity ΣM(N−1) to the time of the (N−1)-th (last) integration process is stored in the memory 302.

In S110, the ECU 300 reads out the integrated memory quantity ΣM(N−1) to the time of the (N−1)-th integration process from the memory 302.

In S120, the ECU 300 acquires the voltage Vb(N) and the current Ib(N) of the battery 100 through the use of the voltage sensor 210 and the current sensor 220, and calculates the OCV(N) by subtracting an amount of fall in voltage (Ib(N)×R) resulting from a charge/discharge current from the voltage Vb(N).

In S130, the ECU 300 acquires the temperature Tb(N) of the battery 100 through the use of the temperature sensor 230. Thus, a condition of use (a combination of the OCV(N) and the temperature Tb(N)) that should be referred to in the map MP1 (see FIG. 7) is determined.

In S140, the ECU 300 stands by until the lapse of the predetermined period Δt. In order to appropriately calculate the memory quantity M, the classification of the conditions of use is required to remain unchanged while the ECU 300 stands by for the predetermined period Δt. In consequence, it is preferable to determine the predetermined period Δt as a period of time in which the classification of the conditions of use does not change while the ECU 300 stands by.

In S150, the ECU 300 calculates the memory quantity M(N) generated in the predetermined period Δt, by referring to the curve corresponding to the condition of use (OCV(N), Tb(N)) from the map MP1 (see FIG. 7) stored in the memory 302. This processing procedure has been described in detail with reference to FIG. 5B, so the description thereof will not be repeated.

In S160, the ECU 300 calculates the integrated memory quantity ΣM(N) to the N-th integration process by adding the memory quantity M(N) calculated in S150 to the integrated memory quantity ΣM(N−1) to the (N−1)-th integration process read out in S110 (see the aforementioned expression (1)). Incidentally, when the vehicle 1 is shipped, an initial value ΣM(0) of the integrated memory quantity is set to, for example, 0. Besides, the initial value ΣM(0) of the integrated memory quantity may be set to 0 after carrying out refresh charge/discharge of the battery 100 as well.

In S170, the ECU 300 stores the integrated memory quantity ΣM(N) calculated in S160 into the memory 302 in case that the flowchart shown in FIG. 8 is invoked next time.

As described above, according to the first embodiment of the invention, the memory quantity M generated at intervals of the predetermined period Δt is calculated in accordance with the condition of use (the OCV and the temperature Tb) of the battery 100, through the use of the curves ($C_P$ to $C_R$ and the like) in the map MP1 prepared in advance based on the results of the experiments conducted by the inventors. The memory quantity M at intervals of the predetermined period Δt can be accurately estimated by adopting the aforementioned parameters as the condition of use. Furthermore, according to the first embodiment of the invention, the integrated memory quantity ΣM is calculated by sequentially integrating the accurately calculated memory quantity M, in view of the electrochemical knowledge that the integrated memory quantity ΣM can be inherited among the aforementioned curves. Thus, the integrated memory quantity ΣM can also be accurately estimated.

Incidentally, in the first embodiment of the invention, the exemplary process for estimating the memory quantity M at intervals of "the predetermined period" Δt has been described. However, it is not indispensable to estimate the memory quantity M on a constant cycle. The length of the predetermined period Δt may be a variable value that depends on the condition of use of the battery 100, the situation of the computation load of the ECU 300 or the like. Alternatively, the condition of use of the battery 100 may be monitored, and the memory quantity M may be estimated regarding a change in the condition of use as a trigger (in other words, regarding the necessity to make a transition among the curves $C_P$ to $C_R$ as a trigger). In this case, periods to a change in the condition of use from a certain condition to another condition (periods $L_P$, $L_Q$ and $L_R$ in FIG. 5B) are equivalent to "the predetermined period". Thus, the computation load of the ECU 300 can be reduced by reducing the number of times of estimation of the memory quantity M.

Next, a modification example of the first embodiment of the invention will be described. When the ECU 300 stops in accordance with the turning-off of an ignition of the vehicle 1 (IG-OFF), the integrated memory quantity ΣM cannot be estimated by carrying out a series of processing procedures shown in the flowchart of the first embodiment of the invention (see FIG. 8). However, as is also apparent from the result of the shelf test of the battery 100 (see FIG. 3), the integrated memory quantity ΣM can increase even during a period in which the vehicle 1 is in an IG-OFF state (hereinafter referred to also as "an IG-OFF period"). It is also conceivable to continue the operation of the ECU 300 even during the IG-OFF period with a view to constantly estimating the integrated memory quantity ΣM. In that case, however, the power consumption of the ECU 300 increases. In the modification example of the first embodiment of the invention, a process for stopping the ECU 300 during the IG-OFF period and estimating the integrated memory quantity ΣM during the IG-OFF period after the turning-on of the ignition of the vehicle 1 (IG-ON) will be described.

Figure 9:
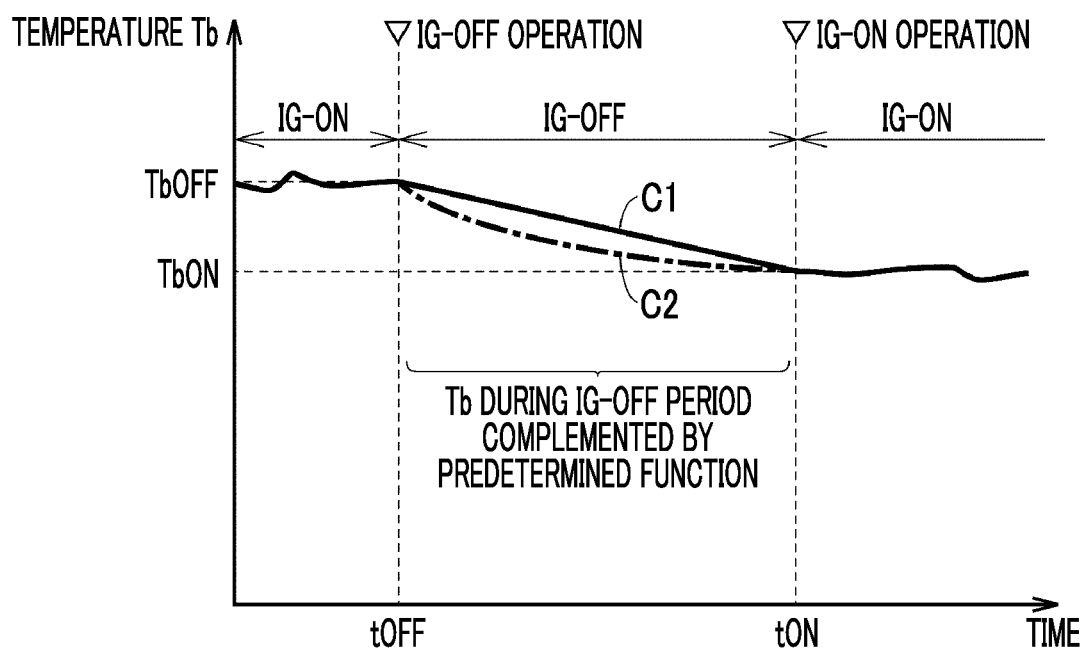
FIG. 9 is a time chart for illustrating a process for estimating an integrated memory quantity generated during an IG-OFF period.

FIG. 9 is a time chart for illustrating the process for estimating the integrated memory quantity ΣM generated during the IG-OFF period. In FIG. 9, the axis of abscissa represents the lapse of time, and the axis of ordinate represents the temperature Tb of the battery 100. During a period to a timing tOFF, the vehicle 1 is in an IG-ON state. IG-OFF operation is carried out at the timing tOFF, and the vehicle 1 makes a transition to the IG-OFF state. After that, IG-ON operation is carried out at a timing tON. In this case, the ECU 300 cannot acquire the temperature Tb in the IG-OFF period from the timing tOFF to the timing tON (the stop period).

Thus, in the modification example of the first embodiment of the invention, the ECU 300 complements the temperature Tb during the IG-OFF period after IG-ON, from a temperature TbOFF of the battery 100 at the timing tOFF and a temperature TbON of the battery 100 at the timing tON. In more concrete terms, the ECU 300 estimates that the temperature Tb changes according to a predetermined function during the IG-OFF period. The type of the function (a function form) is set in advance based on an experimental result or a simulation result. For example, a linear function (see C1) or an exponential function (see C2) can be used. The ECU 300 calculates respective parameters of the aforementioned function in such a manner as to connect the temperature TbOFF and the temperature TbON to each other. Thus, the temperature Tb during the IG-OFF period can be complemented.

Incidentally, although not shown in the drawing, the voltage Vb of the battery 100 during the IG-OFF period is complemented through a similar process after IG-ON. Thus, the OCV during the IG-OFF period can also be complemented.

Figure 10:
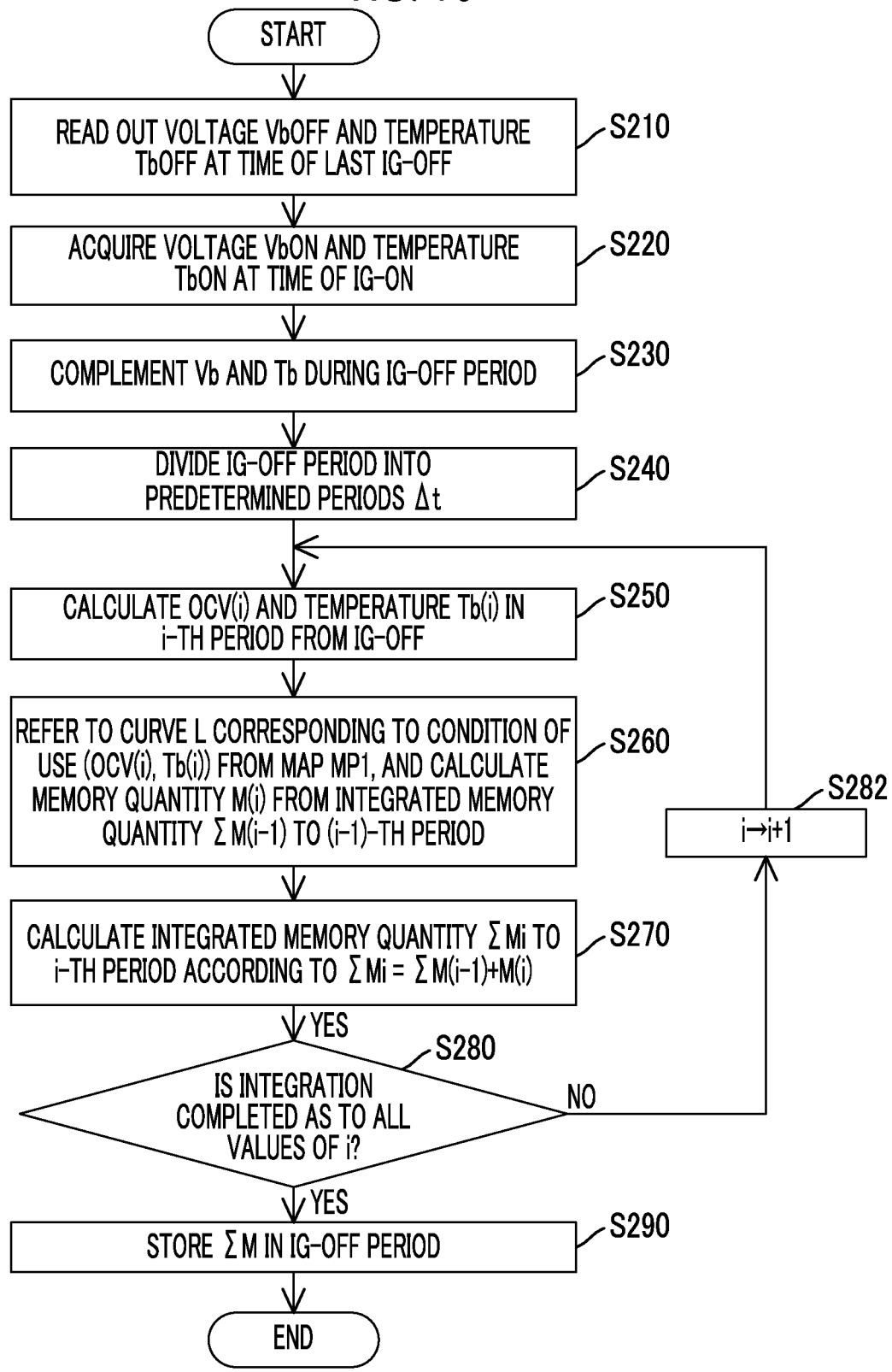
FIG. 10 is a flowchart showing the process for estimating the integrated memory quantity generated during the IG-OFF period.

FIG. 10 is a flowchart showing a process for estimating the integrated memory quantity ΣM generated during the IG-OFF period. This flowchart is executed, for example, when IG-ON operation of the vehicle 1 is carried out. Incidentally, in the modification example of the first embodiment of the invention, when IG-OFF operation is carried out, the ECU 300 stores a voltage VbOFF and the temperature TbOFF of the battery 100 at the time of IG-OFF operation (at the timing tOFF) into the memory 302 in a non-volatile manner, before stopping operating.

In S210, the ECU 300 reads out the voltage VbOFF and the temperature TbOFF (a first condition of use) at the time of last IG-OFF operation from the memory 302. Besides, in S220, the ECU 300 acquires a voltage VbON and the temperature TbON (a second condition of use) at the time of IG-ON operation from the sensors (the voltage sensor 210 and the temperature sensor 230).

In S230, the ECU 300 calculates respective parameters of a function for complementing the voltage Vb during the IG-OFF period, from the voltage VbOFF read out in S210 and the voltage VbON acquired in S220. Besides, the ECU 300 calculates respective parameters of a function for complementing the temperature Tb during the IG-OFF period, from the temperature TbOFF read out in S210 and the temperature TbON acquired in S220. This complementary method has been described in detail with reference to FIG. 9, so the description thereof will not be repeated.

In S240, the ECU 300 divides the IG-OFF period into the predetermined periods Δt. Then in S250, the ECU 300 calculates a voltage Vb(i) and a temperature Tb(i) of the battery 100 in the i-th period among the periods obtained through division, according to the function calculated in S230. Besides, the ECU 300 converts the voltage Vb(i) into an OCV(i). Incidentally, i is a natural number, and the initial value of i is 1.

In S260, the ECU 300 calculates a memory quantity M(i) in the i-th period from an integrated memory quantity ΣM(i−1) to the (i−1)-th period, by referring to a curve corresponding to a condition of use (OCV(i), Tb(i)) from the map MP1 (see FIG. 7). Incidentally, in the case where i=1, a memory quantity M(1) in the first period is calculated from the condition of use and the integrated memory quantity ΣM at the time of IG-OFF operation.

In S270, the ECU 300 calculates an integrated memory quantity ΣM(i) to the i-th period by adding the memory quantity M(i) calculated in S270 to the integrated memory quantity ΣM(i−1) to the (i−1)-th period (see an expression (2) shown below). Incidentally, in the case where i=1, M(1) is added to the integrated memory quantity ΣM at the time of IG-OFF operation.

$$\Sigma M(i)=\Sigma M(i-1)+M(i) \qquad (2)$$

In S280, the ECU 300 determines whether or not the processing procedures of S250 to S270 have been carried out as to all the values of i to integrate the memory quantity M(i). If the integration of the memory quantity M(i) is not completed as to all the values of i (NO in S280), the ECU 300 increments i by 1 (S282), and returns the process to S250. Thus, the processing procedures of S250 to S270 are repeated until the integration of the memory quantity M(i) is completed as to all the values of i. If the integration of the memory quantity M(i) is completed (YES in S280), the ECU 300 stores the integrated memory quantity ΣM during the IG-OFF period into the memory 302 (S290), and returns the process to the main routine.

After that, the process of the flowchart (see FIG. 8) during the IG-ON period is carried out. In this manner, the integrated memory quantity $\Sigma M$ stored into the memory 302 in S290 is read out in the processing procedure (see S110) in which the ECU 300 reads out the integrated memory quantity ($\Sigma M(N-1)$) to the time of the last integration process from the memory 302.

As described above, according to the modification example of the first embodiment of the invention, the accuracy in estimating the integrated memory quantity $\Sigma M$ to the present can be enhanced by taking the memory quantity generated during the IG-OFF period into account as well. Besides, the power consumption of the ECU 300 during the IG-OFF period can be reduced by calculating the integrated memory quantity $\Sigma M$ after IG-ON while stopping the ECU 300 during the IG-OFF period.

Next, the second embodiment of the invention will be described. In general, it is desirable to reduce the computation load of the ECU as much as possible. In the first embodiment of the invention, the memory quantity M is calculated every time the predetermined period $\Delta t$ elapses, so the computation load of the ECU 300 is relatively large. Therefore, in the second embodiment of the invention, a process for reducing the computation load of the ECU 300 will be described. Incidentally, a battery system and a vehicle according to the second embodiment of the invention are identical in configuration to the battery system 2 and the vehicle 1 according to the first embodiment of the invention (see FIGS. 1 and 2).

Figure 11:
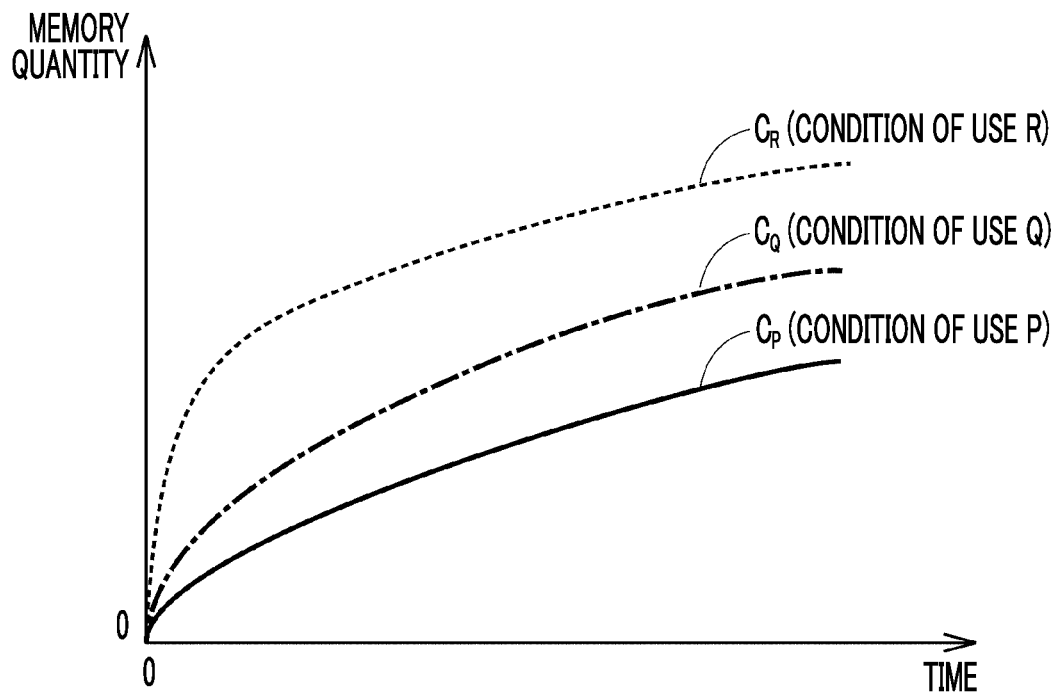
FIG. 11 is a view for illustrating the first embodiment of the invention and the second embodiment of the invention in a contrastive manner.
Figure 11:
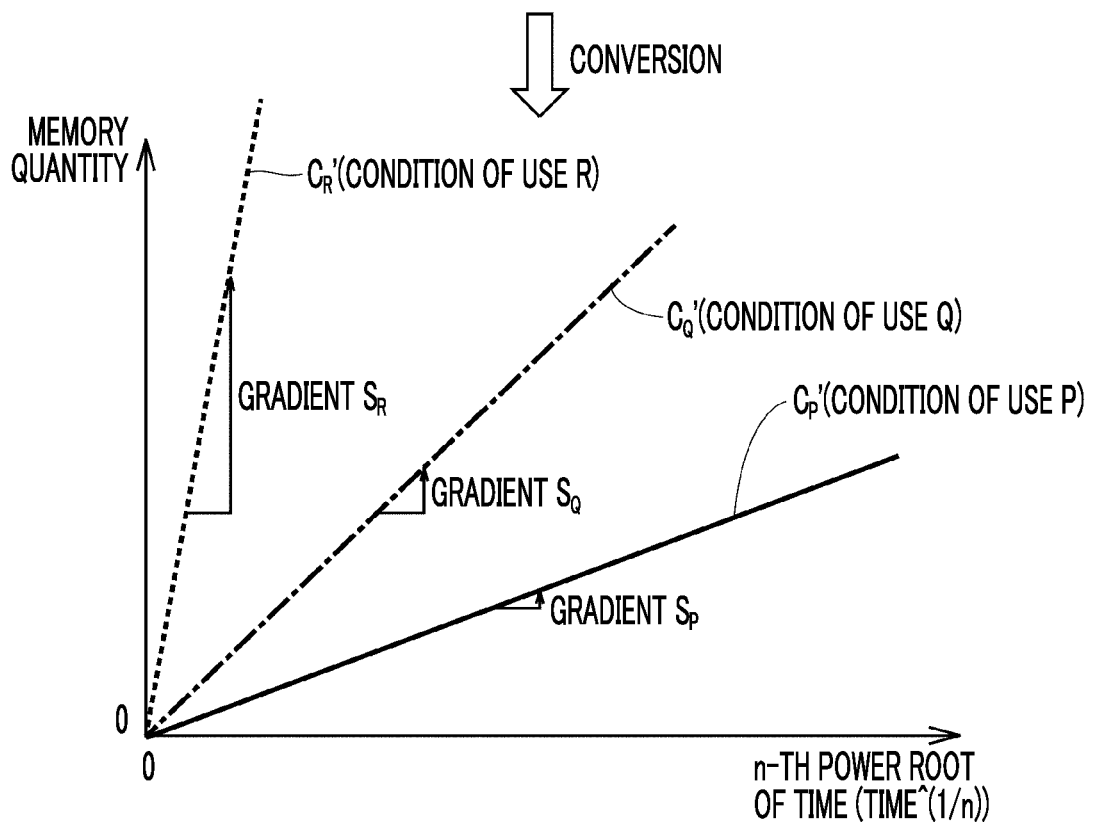

FIG. 11 is a view for illustrating the first embodiment of the invention and the second embodiment of the invention in a contrastive manner. The time chart of the first embodiment of the invention (see FIG. 4) is shown again in an upper part of FIG. 11. The axis of abscissa (the time axis) of this time chart represents an elapsed time from the start of use of the battery 100 on a normal scale.

In contrast, a time chart of the second embodiment of the invention shown in a lower part of FIG. 11 is different from the flowchart of the first embodiment of the invention in that the time axis is on a power root (n-th power root) scale. Changes in the memory quantity under the respective conditions of use P to R can be expressed by straight lines (see straight lines $C_P'$ to $C_R'$) by changing the scale of the axis of abscissa in this manner.

The exponent n of the power root may be a natural number (e.g., 2), but may be a decimal number other than a natural number larger than 1. An optimal value of the exponent n is appropriately determined through an experiment or a simulation such that gradients $S_P$ to $S_R$ of the straight lines (in other words, generation speeds of the memory effect (unit: V/(the n-th power root of the time))) become constant with respect to the n-th power root of the elapsed time. Incidentally, FIG. 11 shows an example in which the axis of ordinate is on a normal scale. However, the scale of the axis of ordinate can also be changed to another scale (e.g., a logarithmic scale).

Figure 12:
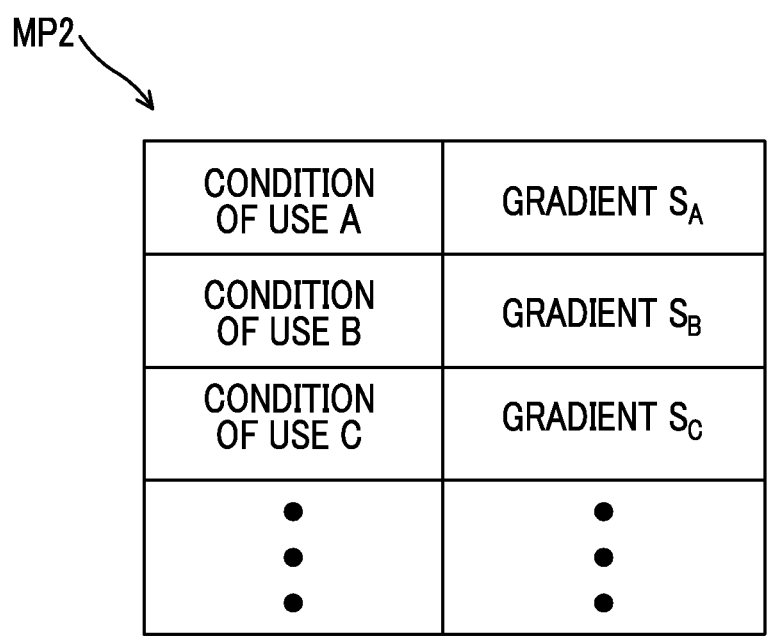
FIG. 12 is a conceptual view of a map in the second embodiment of the invention.

FIG. 12 is a conceptual view of a map MP2 in the second embodiment of the invention. In the map MP2, gradients $S_A$, $S_B$, $S_C$ . . . of straight lines indicating a corresponding relationship between the power root of the elapsed time and the memory quantity individually for the conditions of use (OCV, Tb) respectively are prescribed. As described hitherto, the data volume of the map can be reduced by making the configuration of the map MP2 simpler than the configuration of the map MP1 (see FIG. 7) of the first embodiment of the invention.

In the second embodiment of the invention, as the scale of the axis of abscissa (the time axis) is changed, a period calculation process for calculating a length of a period of use of the battery 100 individually for each of the conditions of use as will be described below is carried out.

Figure 13:
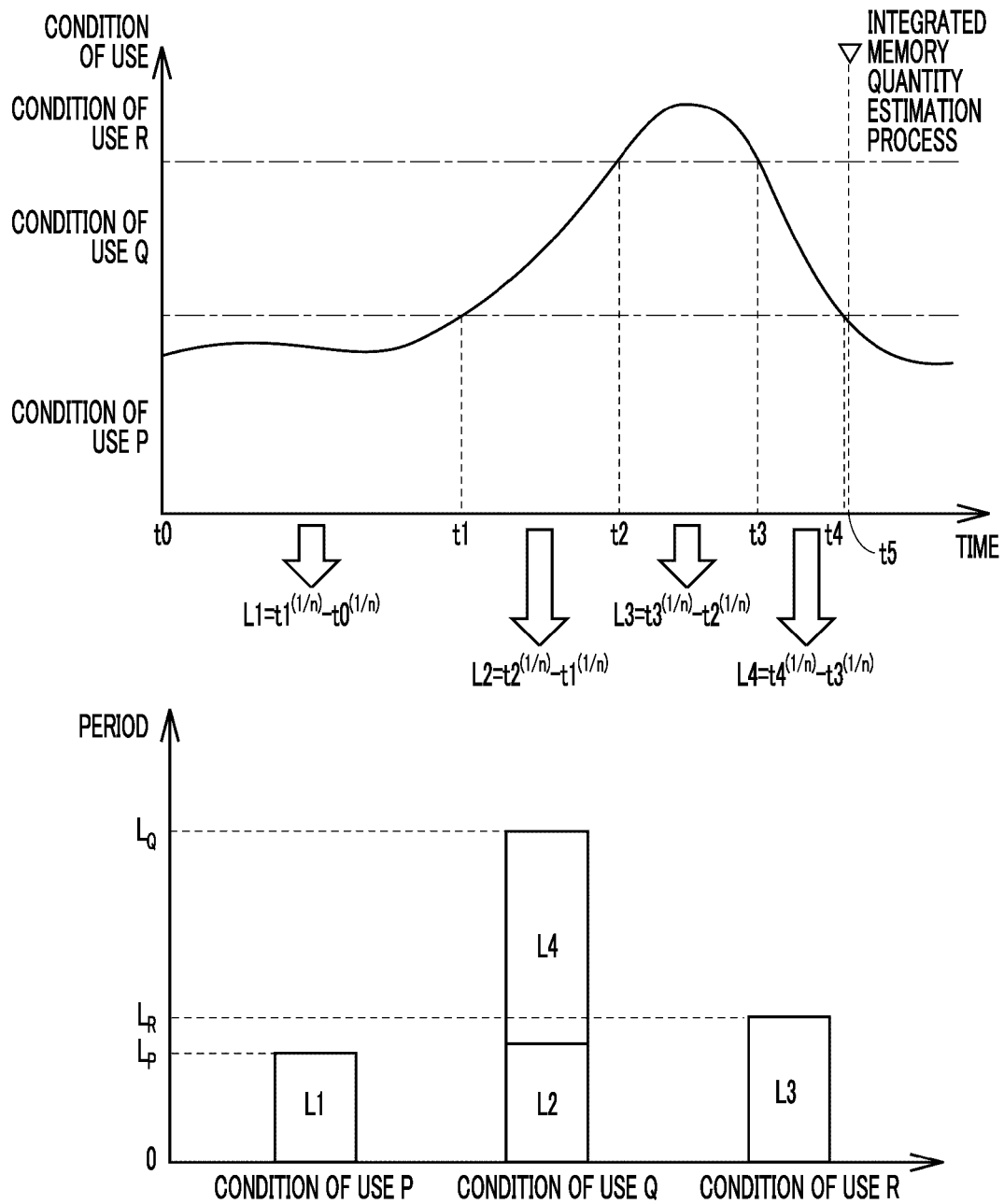
FIG. 13 is a view for illustrating a period calculation process.

FIG. 13 is a view for illustrating the period calculation process. FIG. 13 illustrates an exemplary case where the condition of use of the battery 100 changes in the sequence of P, Q, R, Q and P.

In the second embodiment of the invention, the condition of use as a combination of the OCV and the temperature Tb of the battery 100 is monitored. Then, every time the condition of use changes, the period of use of the battery 100 under the pre-change condition of use is calculated. In an example shown in an upper part of FIG. 13, a period L1 is first calculated according to an expression (3) shown below from a start timing t0 and an end timing t1 of a period in which the condition of use of the battery 100 is P. By the same token, periods L2 to L4 are calculated according to expressions (4) to (6) shown below, respectively.

$$L1 = \text{(the } n\text{-th power root of } t1) - \text{(the } n\text{-th power root of } t0) \quad (3)$$

$$L2 = \text{(the } n\text{-th power root of } t2) - \text{(the } n\text{-th power root of } t1) \quad (4)$$

$$L3 = \text{(the } n\text{-th power root of } t3) - \text{(the } n\text{-th power root of } t2) \quad (5)$$

$$L4 = \text{(the } n\text{-th power root of } t4) - \text{(the } n\text{-th power root of } t3) \quad (6)$$

After that, when the integrated memory quantity estimation process is carried out at a timing t5, the period is added individually for each of the conditions of use P to R. As shown in a lower part of FIG. 13, the total period $L_P$ in which the condition of use of the battery 100 is P is equal to L1 ($L_P$=L1). The total period $L_Q$ of the condition of use Q is expressed as the sum of L2 and L4 ($L_Q$=L2+L4). The total period $L_R$ of the condition of use R is equal to L3 ($L_R$=L3).

Figure 14:
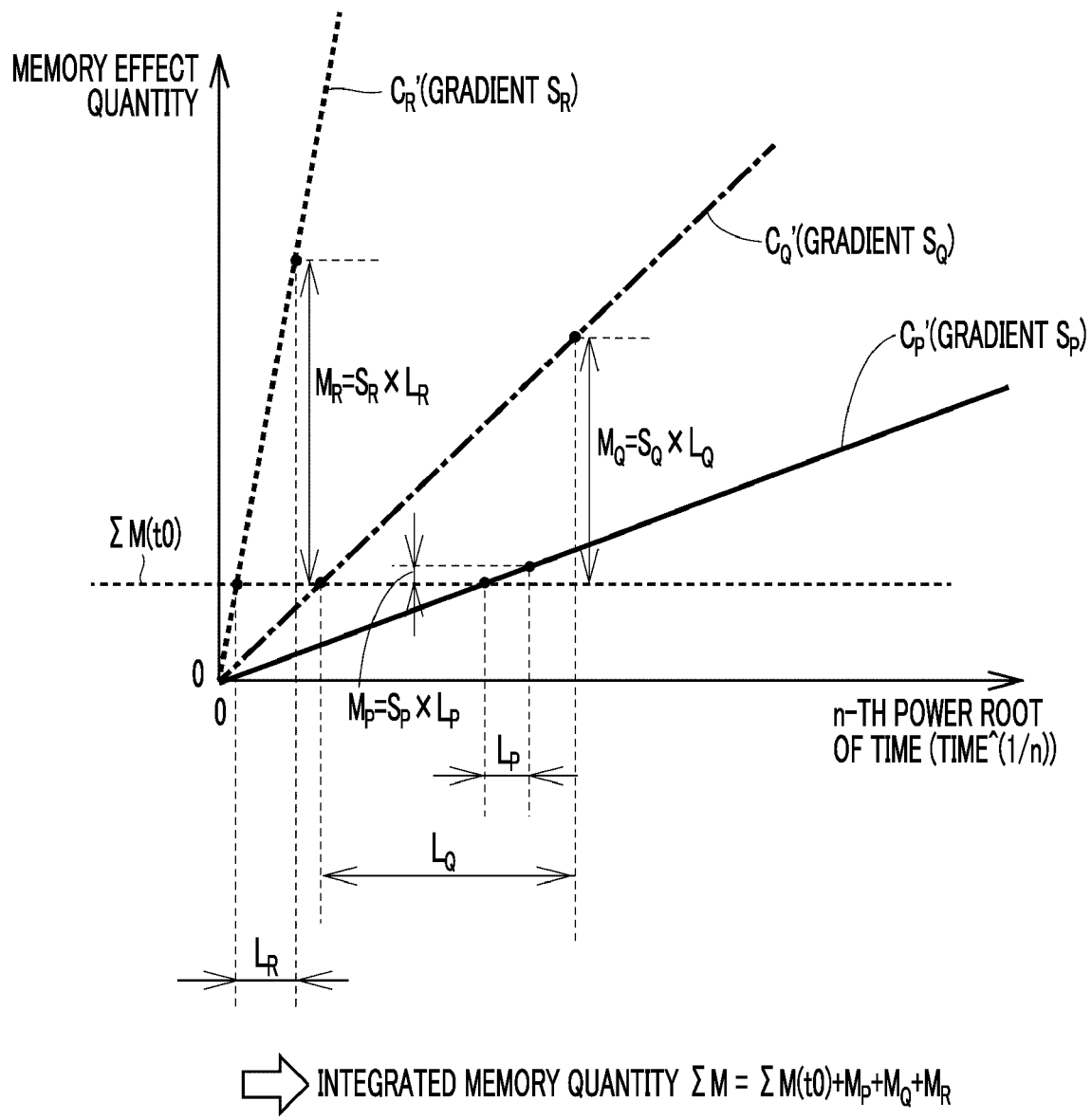
FIG. 14 is a view for illustrating an integrated memory quantity estimation process in the second embodiment of the invention.

FIG. 14 is a view for illustrating the integrated memory quantity estimation process in the second embodiment of the invention. In the second embodiment of the invention, the straight line $C_P'$ represents how the memory quantity increases under the condition of use P. Therefore, a memory quantity $M_P$ generated under the condition of use P can be calculated as a product of the gradient $S_P$ of the straight line $C_P'$ and the period $L_P$ ($M_P = S_P \times L_P$). The same holds true for the conditions of use Q and R.

The integrated memory quantity $\Sigma M$ after the lapse of the total period shown in FIG. 13 (the period from the timing t0 to a timing t4) can be calculated by adding the memory quantities $M_P$ to $M_R$ generated under the conditions of use P to R respectively to an integrated memory quantity $\Sigma M(t0)$ before the start of the aforementioned period (the timing t0 in FIG. 13) ($\Sigma M = \Sigma M(t0) + M_P + M_Q + M_R$).

In the first embodiment of the invention, as described above, the curves represent how the memory quantity increases with the lapse of time (see the curves $C_P$ to $C_R$ in FIG. 5B). Therefore, in calculating the memory quantity M newly generated in a certain period L by referring to the aforementioned curves, information on the integrated memory quantity before the start of the period L is needed to determine points of the curves to be referred to. That is, in the first embodiment of the invention, the points of the curves to be referred to cannot be determined unless the integrated memory quantity $\Sigma M$ is sequentially updated at least every time a transition among the curves is made (every time the condition of use changes).

In contrast, in the second embodiment of the invention, the aforementioned curves are converted into the straight lines (see the straight lines $C_P'$ to $C_R'$) by appropriately determining the exponent n of the power root of the time axis as described with reference to FIG. 11. Thus, the memory quantity M generated in the period L can be calculated as a product of a gradient S of a straight line and the period L, and a computation process for determining a point of the straight line to be referred to is unnecessary. Accordingly, as opposed to the first embodiment of the invention, there is no need to sequentially update the integrated memory quantity $\Sigma M$. The second embodiment of the invention makes it possible to calculate the memory quantities $M_P$, $M_Q$ and $M_R$ at an arbitrary timing, and add the calculated memory quantities $M_P$, $M_Q$ and $M_R$ to the past integrated memory quantity ($\Sigma M(t0)$) at an arbitrary timing.

Figure 15:
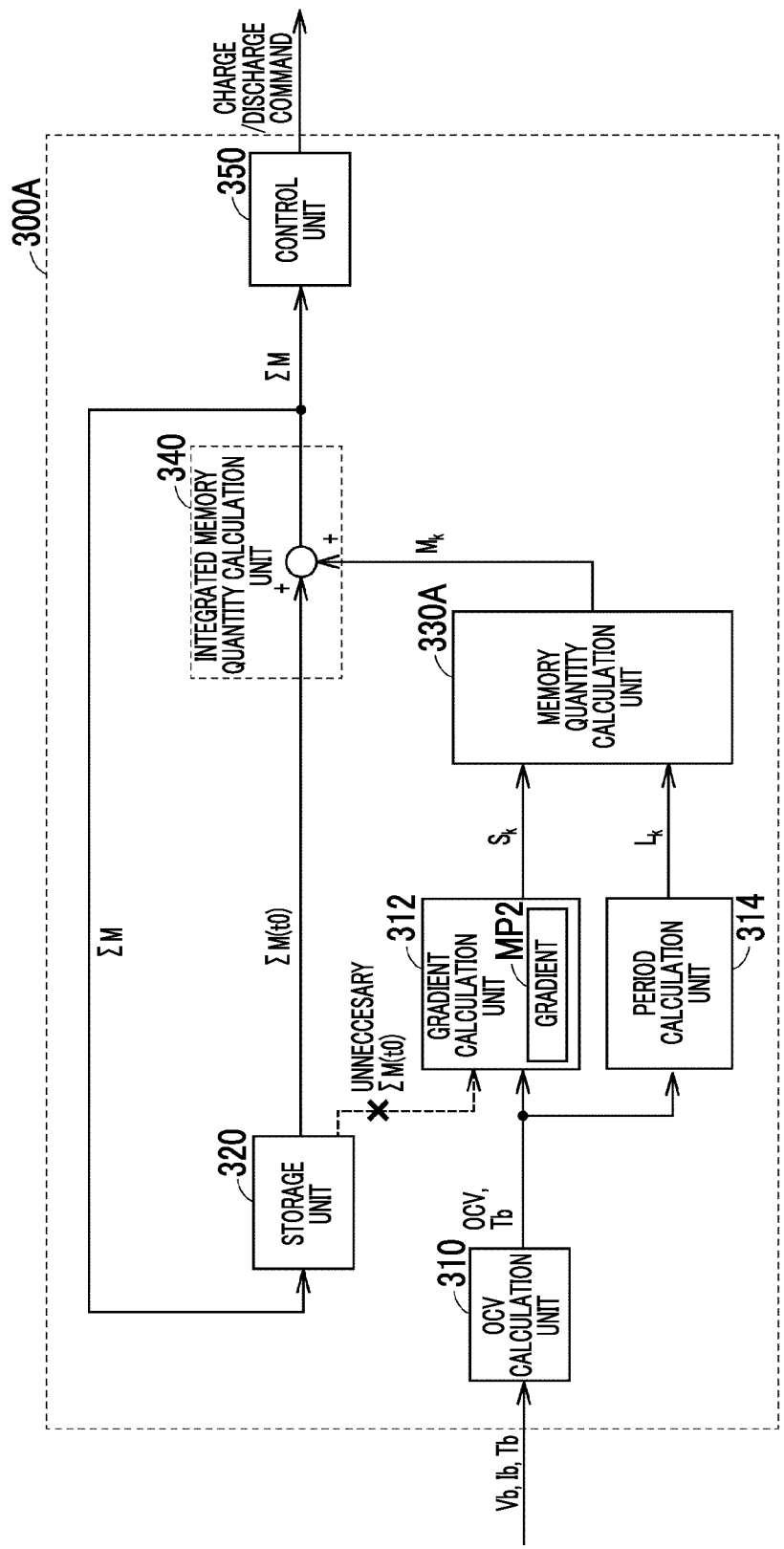
FIG. 15 is a functional block diagram of an ECU in the second embodiment of the invention.

FIG. 15 is a functional block diagram of an ECU 300A in the second embodiment of the invention. The ECU 300A is different from the ECU 300 in the first embodiment of the invention in that the ECU 300A further includes a gradient calculation unit 312 and a period calculation unit 314 and includes a memory quantity calculation unit 330A instead of the memory quantity calculation unit 330.

As is the case with the first embodiment of the invention, the OCV calculation unit 310 calculates the OCV from the voltage Vb of the battery 100, and outputs the OCV and the temperature Tb to the gradient calculation unit 312 and the period calculation unit 314.

Upon receiving the OCV and the temperature Tb from the OCV calculation unit 310, the gradient calculation unit 312 refers to the map MP2 (see FIG. 12), and outputs a gradient $S_k$ of a straight line corresponding to a condition of use to the memory quantity calculation unit 330A. Incidentally, k is a suffix for distinguishing the conditions of use from one another (corresponding to P to R in FIGS. 13 and 14).

Upon receiving the OCV and the temperature Tb from the OCV calculation unit 310, the period calculation unit 314 monitors whether or not the condition of use that is defined by a combination of the OCV and the temperature Tb changes. When the condition of use changes, the period calculation unit 314 calculates a period $L_k$ of use of the battery 100 under the pre-change condition of use, and outputs the calculated period $L_k$ to the memory quantity calculation unit 330A. This calculation method has been described in detail with reference to FIG. 13, so the description thereof will not be repeated.

The memory quantity calculation unit 330A receives the gradient $S_k$ from the gradient calculation unit 312, and receives the period $L_k$ from the period calculation unit 314. The memory quantity calculation unit 330A calculates a product of the gradient $S_k$ of the straight line and the period $L_k$ as a memory quantity $M_k$, and outputs the calculated memory quantity $M_k$ to the integrated memory quantity calculation unit 340. Incidentally, the functions of the integrated memory quantity calculation unit 340 and the control unit 350 are the same as in the first embodiment of the invention.

In the second embodiment of the invention, there is no need to output the past integrated memory quantity ($\Sigma M(t0)$) stored in the storage unit 320 to the memory quantity calculation unit 330A. This is equivalent to the fact that the computation process for determining the points of the straight lines to be referred to is made unnecessary by converting the curves into the straight lines.

Figure 16:
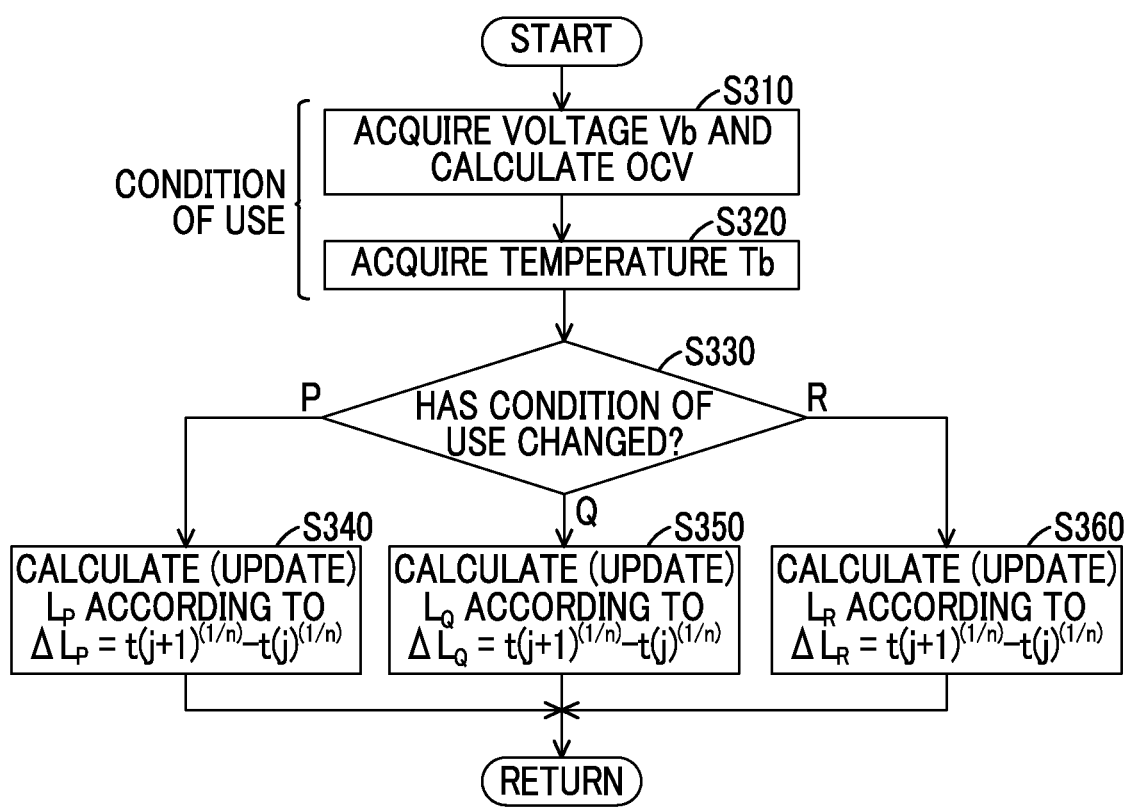
FIG. 16 is a flowchart showing the period calculation process.

FIG. 16 is a flowchart showing the period calculation process. As is the case with the processing procedures of S120 and S130 in the flowchart shown in FIG. 8, the ECU 300A calculates the OCV of the battery 100, and acquires the temperature Tb (S310, S320). That is, the ECU 300A acquires the condition of use of the battery 100.

In S330, the ECU 300A determines whether or not the condition of use has changed from a certain condition to another condition. The ECU 300A stands by until the condition of use changes, and calculates a period of the pre-change condition of use when the condition of use changes. For example, if the condition of use has changed from P to another condition (P in S330), the ECU 300A calculates (updates) the period $L_P$ in which the condition of use is P as a difference between the n-th power root of an end timing t(j+1) of the condition of use P and the n-th power root of a start timing t(j) of the condition of use P (S340) (the timing t(j) is equivalent to t1 to t4 in FIG. 13). The same holds true for the other condition of use Q and R (S350, S360). These processing procedures have been described in detail with reference to FIG. 13, so the description thereof will not be repeated. When the calculation of the period $L_k$ (k=P to R) is completed, the ECU 300A returns the process to the main routine. Thus, the flowchart shown in FIG. 16 is repeatedly carried out.

Figure 17:
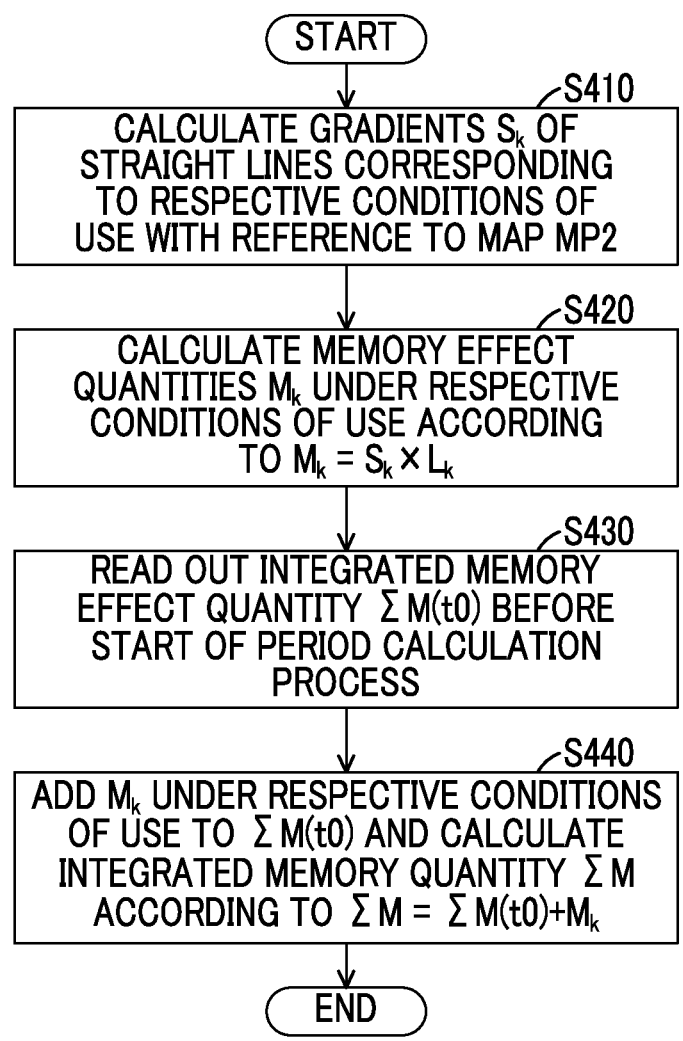
FIG. 17 is a flowchart showing the integrated memory quantity estimation process in the second embodiment of the invention.

FIG. 17 is a flowchart showing the integrated memory quantity estimation process in the second embodiment of the invention. This flowchart can be carried out at an arbitrary timing. Therefore, this flowchart is preferably carried out in a period that is sufficiently long for the computation process of the ECU 300, for example, after IG-OFF operation of the vehicle 1 or the like.

In S410, the ECU 300A calculates the gradients $S_k$ (k=P to R) of the straight lines corresponding to the respective conditions of use, with reference to the map MP2 (see FIG. 12).

In S420, the ECU 300A calculates the memory quantities $M_k$ under the respective conditions of use. Each of the memory quantities $M_k$ is calculated as a product of the gradient $S_k$ of the straight line calculated in S410 and the period $L_k$ calculated through the flowchart shown in FIG. 16 ($M_k = S_k \times L_k$).

In S430, the ECU 300A reads out the integrated memory quantity $\Sigma M(t0)$ before the start of the period calculation process (the timing t0 in FIG. 13) from the memory 302.

In S440, the ECU 300A updates the integrated memory quantity $\Sigma M$ by adding the memory quantities $M_k$ under the respective conditions of use (the memory quantities $M_k$ as to all the values of k) to the integrated memory quantity $\Sigma M(t0)$ at the timing t0 ($\Sigma M = \Sigma M(t0) + M_k$). After that, the ECU 300A returns the process to the main routine.

As described above, according to the second embodiment of the invention, data indicating a corresponding relationship between the memory quantity and the elapsed time from the start of use of the battery 100 (see FIG. 11) are converted from the curves ($C_P$ to $C_R$) to the straight lines ($C_P'$ to $C_R'$) by changing the time axis from the normal scale of the elapsed time to the power root scale of the elapsed time. This conversion is realized by determining the exponent n of the power root such that the generation speeds (the gradients $S_P$ to $S_R$) of the memory quantity become constant with respect to the power root of the elapsed time. Thus, it is sufficient to store the map MP2, which prescribes the gradients of the straight lines instead of the shapes of the curves, into the memory 302. Therefore, the data volume of the map can be reduced.

Furthermore, according to the second embodiment of the invention, the computation process for determining the points of the straight lines to be referred to is made unnecessary by using the straight lines. Therefore, as opposed to the first embodiment of the invention, there is no need to sequentially update the integrated memory quantity $\Sigma M$. That is, the integrated memory quantity $\Sigma M$ can be calculated at an arbitrary timing. Therefore, the integrated memory quantity $\Sigma M$ can be calculated in a period in which the computation load of the ECU 300A is relatively small, for example, after IG-OFF operation of the vehicle 1 is carried out (or in a period in which the vehicle 1 is temporarily stopped).

Next, a modification example of the second embodiment of the invention will be described. In the second embodiment of the invention, the difference between the n-th power root of an end timing of a certain condition of use and the n-th power root of a start timing of the condition of use is calculated in calculating the period in which the battery 100 is used under each of the conditions of use, as described with reference to the aforementioned expressions (3) to (6). This computation must be carried out as the condition of use changes. Therefore, in the case where the condition of use frequently changes, the calculation load of the ECU 300A may become relatively large. In the modification example of the second embodiment of the invention, a process for further reducing the computation load of the ECU 300A will be described.

Figure 18:
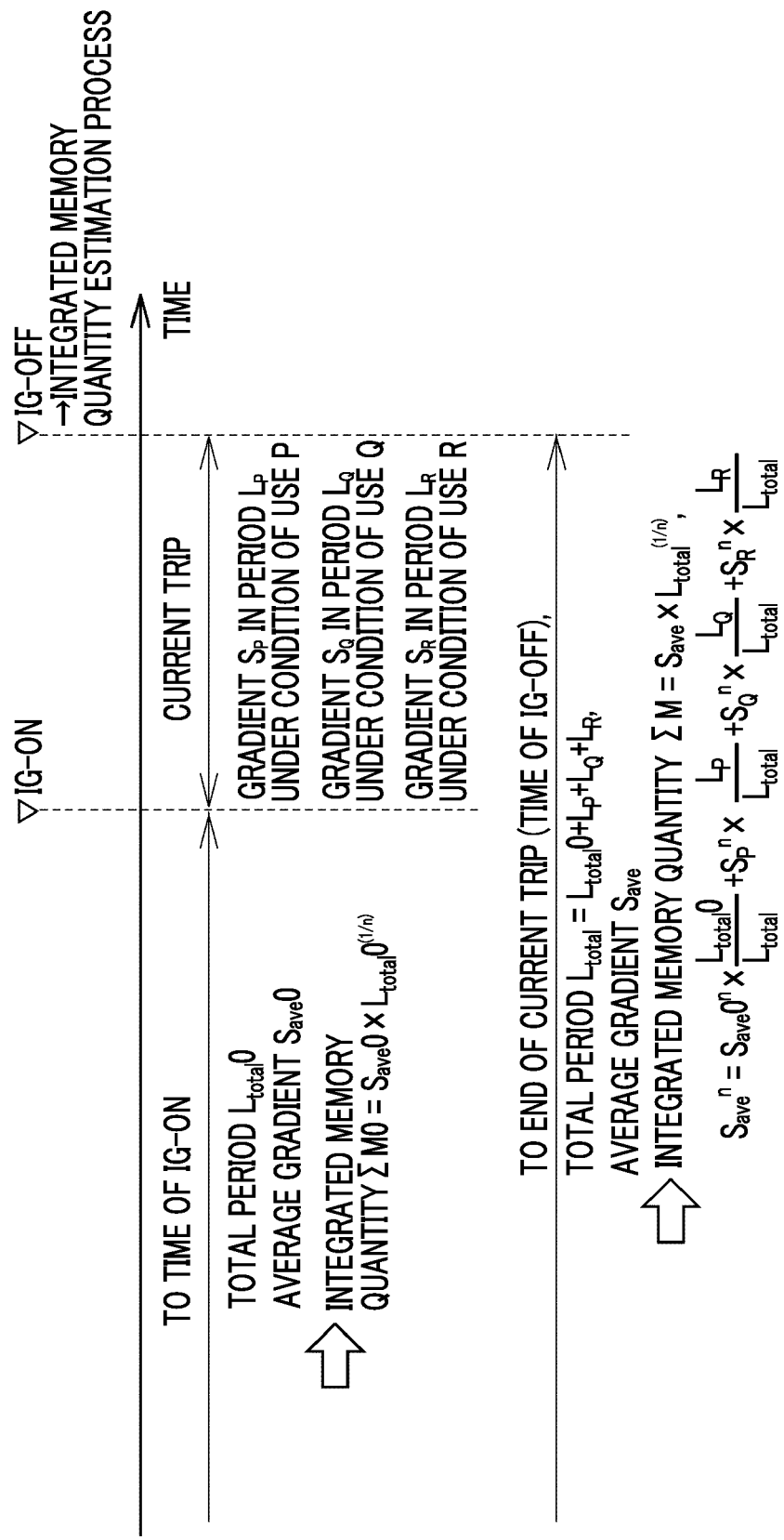
FIG. 18 is a view for illustrating an integrated memory quantity estimation process in a modification example of the second embodiment of the invention.

FIG. 18 is a view for illustrating the integrated memory quantity estimation process in the modification example of the second embodiment of the invention. This integrated memory quantity estimation process can be carried out at an arbitrary timing. However, an exemplary case where a memory quantity during a certain trip (during the IG-ON period from the time of IG-ON to the time of IG-OFF) is estimated after the end of the trip will be described hereinafter. In the modification example of the second embodiment of the invention, for example, a total period $L_{total}$ indicating a total value of the elapsed period from the time of the shipment of the vehicle 1, and an average gradient $S_{ave}$ of the memory quantity from the time of the shipment of the vehicle 1 are updated in accordance with the condition of use during the IG-ON period.

More specifically, as shown in FIG. 18, the total period from the time of the shipment of the vehicle 1 to the time of IG-ON is denoted by $L_{total}0$. An average gradient $S_{ave}0$ (unit: V/(the n-th power root of the time)) of the memory quantity to the time of IG-ON is stored in the memory 302 of the ECU 300A. In this case, the integrated memory quantity $\Sigma M0$ to the time of IG-ON is expressed as a product of the average gradient $S_{ave}0$ and the n-th power root of the total period $L_{total}0$ ($\Sigma M0 = S_{ave}0 \times$(the n-th power root of $L_{total}0$)).

The total period $L_{total}$ to the end of the current trip (the time of IG-OFF) is calculated as a sum of the total period $L_{total}0$, the period $L_P$ in which the battery 100 is under the condition of use P during the IG-ON period, the period $L_Q$ under the condition of use Q and the period $L_R$ under the condition of use R ($L_{total} = L_{total}0 + L_P + L_Q + L_R$). Using the example shown in FIG. 13 again, the respective periods $L_P$, $L_Q$ and $L_R$ are calculated according to expressions (7) to (9) shown below respectively, and the computation of the power root as in the second embodiment of the invention is not carried out (see the aforementioned expressions (3) to (6)).

$$L_P = t1 - t0 \qquad (7)$$

$$L_Q = (t2 - t1) + (t4 - t3) \qquad (8)$$

$$L_R = t3 - t2 \qquad (9)$$

On the other hand, in calculating the average gradient $S_{ave}$, the gradients $S_{ave}0$ and $S_P$ to $S_R$ are weighted in accordance with the lengths of the total period $L_{total}0$ and the periods $L_P$ to $L_R$, as indicated by an expression (10) shown below. Incidentally, the n-th power of the gradient $S_{ave}$ is shown on the left side of the expression (10) to make the expression easily viewable.

$$S_{ave}{}^n = S_{ave}0^n \times (L0/L_{total}) + S_P{}^n \times (L_P/L_{total}) + S_Q{}^n \times (L_Q/L_{total}) + S_R{}^n \times (L_R/L_{total}) \qquad (10)$$

The integrated memory quantity $\Sigma M$ at the end of the trip is expressed by an expression (11) shown below, using the total period $L_{total}$ calculated as described above and the average gradient $S_{ave}$ calculated as described above.

$$\Sigma M = S_{ave} \times (\text{the } n\text{-th power root of } L_{total}) \qquad (11)$$

Figure 19:
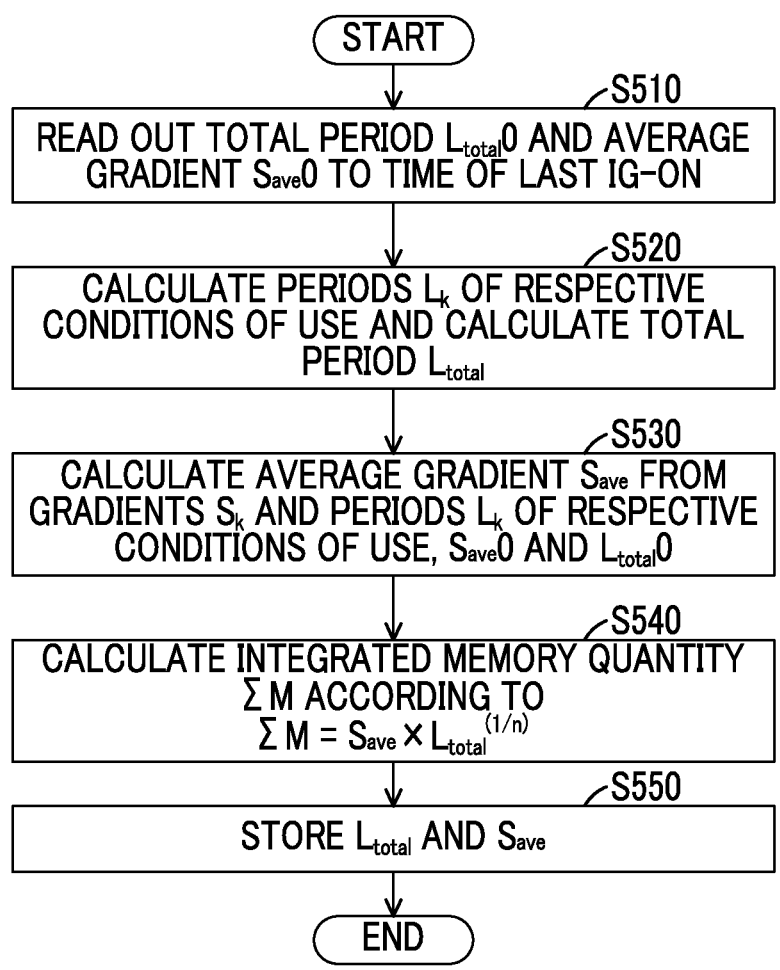
FIG. 19 is a flowchart showing the integrated memory quantity estimation process in the modification example of the second embodiment of the invention.

FIG. 19 is a flowchart showing the integrated memory quantity estimation process in the modification example of the second embodiment of the invention. As is the case with the second embodiment of the invention, this process is carried out, for example, when IG-OFF operation of the vehicle 1 is carried out.

In S510, the ECU 300A reads out the total period $L_{total}0$ and the average gradient $S_{ave}0$ to the time of last IG-ON from the memory 302.

In S520, the ECU 300A calculates the period $L_k$ (k=P to R) under the respective conditions of use during the IG-ON period. This processing procedure is realized by calculating the sum of the periods individually for each of the conditions of use as described with reference to the aforementioned expressions (7) to (9), and the computation of the power root is not carried out. Furthermore, the ECU 300A calculates the total period $L_{total}$ to the end of the current trip ($L_{total} = L_{total}0 + L_P + L_Q + L_R$).

In S530, the ECU 300A calculates the average gradient $S_{ave}$ to the end of the current trip, using the gradients $S_k$ (k=P to R) of the memory quantities and the periods $L_k$ corresponding to the respective conditions of use and the average gradient $S_{ave}0$ and the total period $L_{total}0$ to the time of IG-ON (see the aforementioned expression (10)).

In S540, the ECU 300A calculates the integrated memory quantity $\Sigma M$ to the end of the current trip (see the aforementioned expression (11)).

In S550, the ECU 300A stores the calculated integrated memory quantity $\Sigma M$ and the total period $L_{total}$ calculated in S520 into the memory 302 in preparation for a subsequent process. After that, the ECU 300A returns the process to the main routine.

As described above, according to the modification example of the second embodiment of the invention, the integrated memory quantity $\Sigma M$ can be calculated at an arbitrary timing by using the straight lines (the gradients of the memory quantity) in the same manner as in the second embodiment of the invention.

In the second embodiment of the invention, the computation of the power root (see the aforementioned expressions (3) to (6)) must be carried out as the condition of use changes, in calculating the periods $L_k$ (k=P to R) of the respective conditions of use. Therefore, the computation load can be large when the condition of use frequently changes. In contrast, according to the modification example of the second embodiment of the invention, information on the periods $L_k$ of the respective conditions of use are included in the average gradient $S_{ave}$ of the memory quantity as indicated by the aforementioned expression (10). The computation of the power root is not carried out in calculating the periods $L_k$ (see the aforementioned expressions (7) to (9)). Accordingly, even in the case where the condition of use frequently changes, the computation load of the average gradient $S_{ave}$ and the periods $L_k$ can be restrained from increasing.

Incidentally, the modification example of the first embodiment of the invention can also be applied to the second embodiment of the invention (or the modification example thereof). That is, the integrated memory quantity estimation process can be carried out in the IG-OFF period as well in the same manner as described in the second embodiment of the invention (or the modification example thereof), by complementing the condition of use during the IG-OFF period as described in the modification example of the first embodiment of the invention.

The embodiments of the invention disclosed herein should be considered to be exemplary and nonrestrictive in all respects. The scope of the invention is defined not by the foregoing description of the embodiments thereof but by the claims. The invention is intended to encompass all the alterations that are equivalent in significance and scope to the claims.

What is claimed is:

1. A battery system comprising:
    a nickel hydride battery; and
    an electronic control unit configured to:
    store data indicating a corresponding relationship between an elapsed time from a start of use of the nickel hydride battery and a memory quantity from the start of use of the nickel hydride battery, the stored data comprising historical data corresponding individually to a plurality of conditions of use based on an open circuit voltage of the nickel hydride battery and a temperature of the nickel hydride battery,
    calculate, with reference to the stored data, a memory quantity within a time when classification of the conditions of use does not change, the memory quantity being a quantity indicating an amount of change in voltage resulting from a memory effect of the nickel hydride battery, and
    estimate a total memory quantity of the nickel hydride battery by integrating the calculated memory quantity into a previously estimated total memory quantity,
    wherein, in response to a condition of use changing, the memory quantity is calculated and integrated into the total memory quantity.

2. The battery system according to claim 1, wherein
    the electronic control unit is configured to repeatedly carry out a total memory quantity estimation process for estimating the total memory quantity indicating an integrated value of the memory quantity, the total memory quantity estimation process being a process for calculating, with reference to data corresponding to the conditions of use during a predetermined period, the total memory quantity from a previously estimated total memory quantity at a start of the predetermined period and the conditions of use during the predetermined period, by adding a memory quantity generated during the predetermined period to the previously estimated total memory quantity at the start of the predetermined period.

3. The battery system according to claim 1, wherein
    the stored data comprises data indicating a corresponding relationship between an $n^{th}$ root of the elapsed time and a generation speed of the memory quantity,
    an exponent of the $n^{th}$ root is determined such that the generation speed becomes constant with respect to the $n^{th}$ root of the elapsed time,
    the electronic control unit is configured to calculate, with reference to the stored data corresponding to the conditions of use during a predetermined period, the generation speed during the predetermined period,
    the electronic control unit is configured to calculate a product of the generation speed and an $n^{th}$ root of the predetermined period as the memory quantity generated during the predetermined period, and
    the electronic control unit is configured to estimate a total memory quantity at an end of the predetermined period by adding the calculated memory quantity to a previously estimated total memory quantity from a start of the predetermined period.

4. The battery system according to claim 1, wherein
    the electronic control unit is configured to acquire a first condition of use at a time of stopping the battery system and a second condition of use at a time of activating the battery system,
    the electronic control unit is configured to determine, based on the first condition of use and the second condition of use, a condition of use in a stop period of the battery system from the time of stopping the battery system to the time of activating the battery system, and
    the electronic control unit is configured to calculate, with reference to the data corresponding to the determined condition of use, a memory quantity generated during the stop period.

* * * * *